(12) United States Patent
Kasukabe et al.

(10) Patent No.: US 6,900,646 B2
(45) Date of Patent: May 31, 2005

(54) PROBING DEVICE AND MANUFACTURING METHOD THEREOF, AS WELL AS TESTING APPARATUS AND MANUFACTURING METHOD OF SEMICONDUCTOR WITH USE THEREOF

(75) Inventors: Susumu Kasukabe, Yokohama (JP); Akio Hasebe, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 140 days.

(21) Appl. No.: 10/119,077

(22) Filed: Apr. 10, 2002

(65) Prior Publication Data

US 2002/0135387 A1 Sep. 26, 2002

Related U.S. Application Data

(63) Continuation of application No. 09/285,074, filed on Apr. 2, 1999, now Pat. No. 6,617,863.

(30) Foreign Application Priority Data

Apr. 3, 1998 (JP) .......................................... 10-091289

(51) Int. Cl.[7] .............................................. G01R 31/02

(52) U.S. Cl. .................................... 324/754; 324/158.1

(58) Field of Search .............................. 324/754, 758, 324/158.1, 765, 761, 763, 725; 439/912, 70, 68, 482, 66; 29/593, 825, 859

(56) References Cited

U.S. PATENT DOCUMENTS

| | | |
|---|---|---|
| 3,998,678 A | 12/1976 | Fukase et al. |
| 4,038,599 A | 7/1977 | Bove et al. |

(Continued)

FOREIGN PATENT DOCUMENTS

| | | |
|---|---|---|
| EP | 0123456 | 1/2000 |
| JP | 63-43749 | 10/1988 |
| JP | 63-152243 | 10/1988 |
| JP | 64-71141 | 3/1989 |
| JP | 1-123157 | 5/1989 |
| JP | 1-141379 | 6/1989 |
| JP | 1-150863 | 6/1989 |
| JP | 1-184477 | 7/1989 |
| JP | 1-219566 | 9/1989 |
| JP | 1-300532 | 12/1989 |
| JP | 3-69131 | 3/1991 |
| JP | 5-29406 | 2/1993 |
| JP | 5-196691 | 8/1993 |
| JP | 6-252226 | 9/1994 |

(Continued)

*Primary Examiner*—Kamand Cuneo
*Assistant Examiner*—Jimmy Nguyen
(74) *Attorney, Agent, or Firm*—Mattingly, Stanger & Malur, P.C.

(57) ABSTRACT

A probing device for electrically contacting with a plurality of electrodes 3, 6 aligned on an object 1 to be tested so as to transfer electrical signal therewith, comprising: a wiring sheet being formed by aligning a plurality of contact electrodes 21, 110b, corresponding to each of said electrodes, each being planted with projecting probes 20, 110a covered with hard metal films on basis of a conductor thin film 41 formed on one surface of an insulator sheet 22 of a polyimide film by etching thereof, while extension wiring 23, 110c for electrically connecting to said each of said contact electrodes being formed on basis of a conductor thin film formed on either said one surface or the other surface opposing thereto of said insulator sheet of the polyimide film; and means for giving contacting pressure for obtaining electrical conduction between said extension wiring and said object to be tested by contacting tips of said projecting contact probe formed onto said each contact electrode through giving pressuring force between said wiring sheet and said object to be tested.

34 Claims, 14 Drawing Sheets

U.S. PATENT DOCUMENTS

| | | | |
|---|---|---|---|
| 4,464,825 A | | 8/1984 | Ports |
| 4,952,272 A | | 8/1990 | Okino et al. |
| 5,391,259 A | | 2/1995 | Cathey et al. |
| 5,399,238 A | | 3/1995 | Kumar |
| 5,410,259 A | * | 4/1995 | Fujihara et al. ............. 324/758 |
| 5,428,298 A | | 6/1995 | Ko |
| 5,461,327 A | * | 10/1995 | Shibata et al. ............. 324/760 |
| 5,559,446 A | * | 9/1996 | Sano ......................... 324/760 |
| 5,604,446 A | | 2/1997 | Sano |
| 5,747,358 A | | 5/1998 | Gorrell et al. |
| 5,793,117 A | | 8/1998 | Shimada et al. |
| 5,825,192 A | | 10/1998 | Hagihara |
| 5,848,465 A | | 12/1998 | Hino et al. |
| 5,854,513 A | | 12/1998 | Kim |
| 6,059,982 A | | 5/2000 | Palagonia et al. |
| 6,060,768 A | | 5/2000 | Hayashida et al. |
| 6,064,216 A | | 5/2000 | Farnworth et al. |
| 6,078,186 A | | 6/2000 | Hembree et al. |
| 6,117,299 A | | 9/2000 | Rinne et al. |
| 6,133,534 A | | 10/2000 | Fukutomi et al. |
| 6,181,145 B1 | * | 1/2001 | Tomita et al. ............. 324/754 |
| 6,246,250 B1 | | 6/2001 | Doherty et al. |
| 6,250,933 B1 | | 6/2001 | Khoury et al. |
| 6,476,626 B2 | * | 11/2002 | Aldaz et al. ................ 324/757 |

FOREIGN PATENT DOCUMENTS

| | | |
|---|---|---|
| JP | 7-12849 | 1/1995 |
| JP | 7 27789 | 1/1995 |
| JP | 7-283280 | 10/1995 |
| JP | 8-29454 | 2/1996 |
| JP | 9-196969 | 7/1997 |
| JP | 9-203749 | 8/1997 |

* cited by examiner

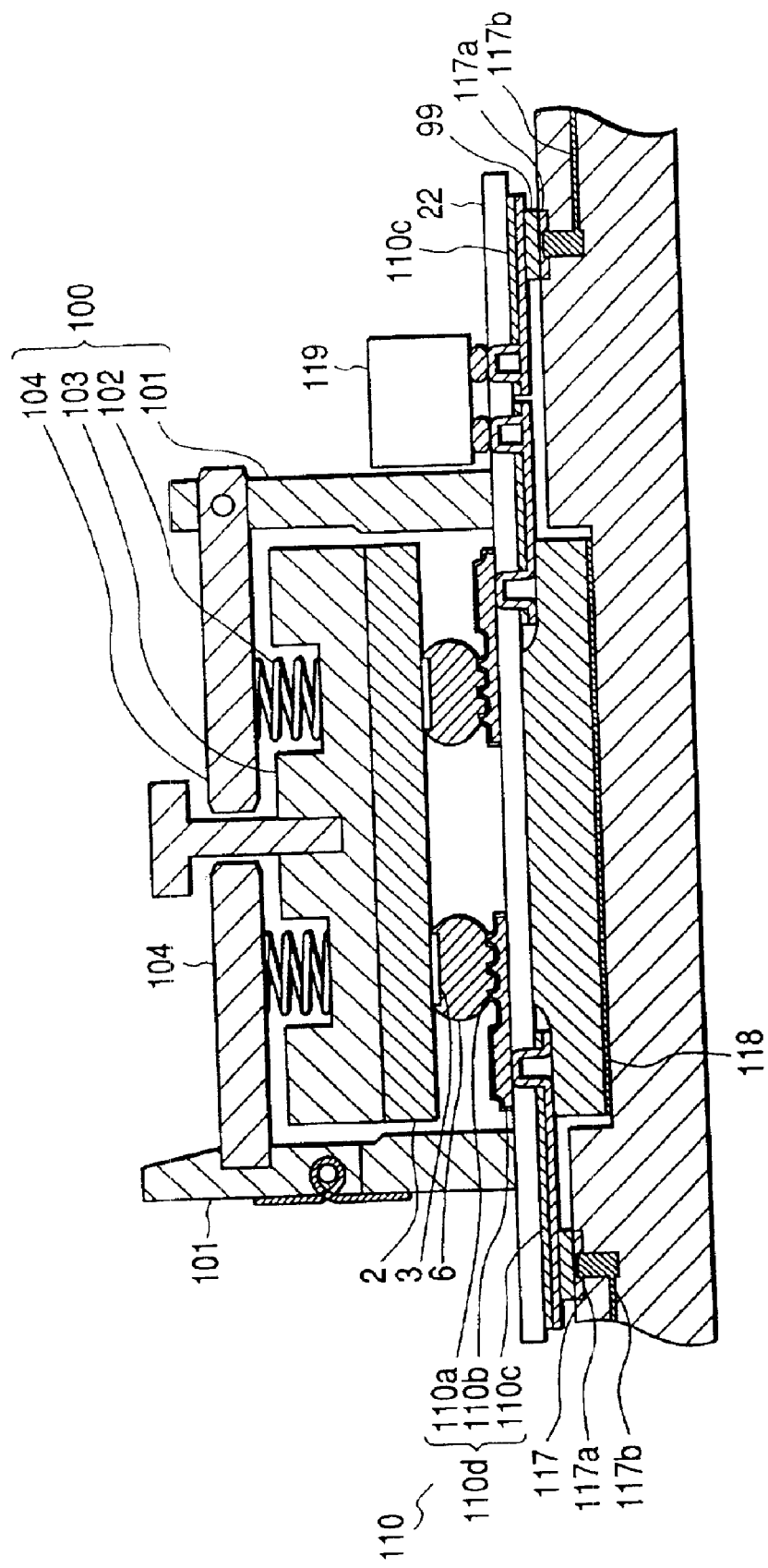

FIG. 16(a) PRIOR ART   FIG. 16(b) PRIOR ART
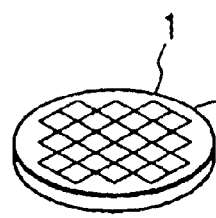
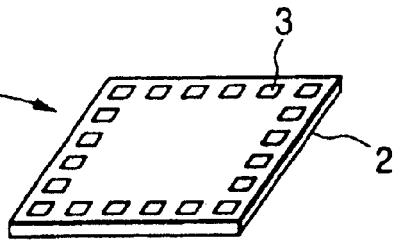
FIG. 17 PRIOR ART
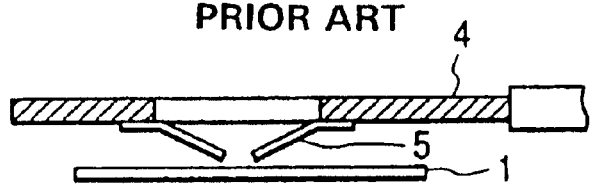
FIG. 18 PRIOR ART
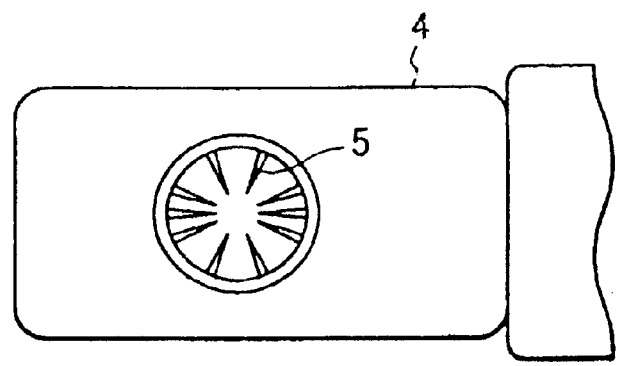

PROBING DEVICE AND MANUFACTURING METHOD THEREOF, AS WELL AS TESTING APPARATUS AND MANUFACTURING METHOD OF SEMICONDUCTOR WITH USE THEREOF

This is a continuation application of U.S. Ser. No. 09/285,074, filed Apr. 2, 1999, now U.S. Pat. No. 6,617,863.

BACKGROUND OF THE INVENTION

1. Field of the Invention

The present invention relates to a probing device and a manufacturing method thereof, as well as a testing apparatus and a manufacturing method with use thereof, in which electric signals are transferred through contact probes being contacted with electrodes opposing thereto on an object to be tested, and in particular to a probing device and a manufacturing method thereof, as well as a testing apparatus and a manufacturing method of a semiconductor with use thereof, especially being suitable for contacting with a large number of the electrodes provided on the semiconductor with high density.

2. Description of Prior Art

A wafer 1 shown in FIG. 16(A), on a surface of which are provided or constructed with a large number of semiconductor elements 2 (i.e., chips) for producing LSI, is cut and separated to be supplied for use thereof. FIG. 16(B) shows an enlarged perspective view on one of the above semiconductor elements 2. On a surface of the each semiconductor element 2 are provided a large number of electrodes 3 alighting along the periphery thereof.

For producing such the semiconductor elements industrially in a large number thereof and for inspecting or testing the electric performances thereof, a probing device (prior art 1) of such the structure shown in FIGS. 17 and 18 is used. This prior art 1 is constructed with a probe card 4 and probes 5 of a tungsten wire projecting obliquely therefrom. In testing with use of this probing device, such a method is applied to, in which the contact with the electrodes are obtained by rubbing the probes 5 by use of flexibility thereof to test the electric property of the semiconductor elements.

Further, with further advance in high density and narrow pitching of the semiconductor element, as a testing method and a testing apparatus enabling the property test of the semiconductor element with which an operation test is needed with a high speed signal, a technology is already known as disclosed in Japanese Patent Laying-Open No. Sho 64-71141 (1989) (prior art 2). In this prior art 2, a spring probe is used, in the shape of which two pieces of movable pins, being biased by springs to project into directions opposing to each other, are inserted into a tube so as to freely come and go. Namely, the movable pin at one end of this spring is abutted on the electrode of an object to be tested, while the movable pin at the other end thereof is abutted on the electrode provided on a substrate of a measuring circuit, thereby performing the test or inspection.

Also, as a probe apparatus (probing device) of the conventional art is also known that shown in Japanese Patent Laying-Open No. Hei 1-123157 (1989) (prior art 3). Namely, according to this prior art 3, there is described that, on a probe head for transferring electric signals with contacting on the electrode pads of the semiconductor LSI, alignments of electrode pads are formed on both side surfaces thereof, and further provided with a multi-layer print board through which the above-mentioned pads on the both surfaces are connected to each other in a specific relationship of arrangement, and a pin probe (being formed with a selective wet etching) being planted and fixed on the each pad through a conductor layer on the one side surface of the multi-layer print board, which has a thick base portion and a tip having a fine or minute flat portion, i.e., a pyramid-like shape including a conical shape and a polygonal cone.

However, in recent years, with advance in the multiplication of probes and with the increase of density thereof, it is desired to develop a simple and easy probing device for transferring electric signals between the electrodes of the semiconductor element and testing circuitry.

However, with the testing method of the probe card which is shown as the prior art 1 in FIGS. 17 and 18 mentioned above, there is a limit for the testing with high speed signals due to the shape of the probe 5, in which lumped inductance is large. Namely, assuming that a property impedance of signal lines on the probe card is R, the lumped impedance of the probe is L, then a time constant can be expressed as L/R, and it come 1 ns in a case where R=50 ohm and L=50 nH. Then the wave-form is rounded or deteriorated when dealing such the high speed signal, therefore it is impossible to achieve accurate inspection or test. Accordingly, with such the method, it is restricted only to the testing of the direct current (DC) property, ordinarily. Further, with the probing method mentioned above, there is also a limitation in the special arrangement, therefore it cannot cope with the high density of the electrodes and the multiplication in the total number thereof on the semiconductor element.

Further, with the method of the prior art 2 mentioned above in which a spring probe having two pieces of the movable pins is utilized, since the probe is relatively short in length thereof, the high speed electric performance can be tested. However, a self inductance thereof is proportional to the length of the bare probe. Accordingly, in a case of probe of a diameter 0.2 mm and a length 10 mm, the inductance of it comes to be around 9 nH. A stroke noise disturbing the high speed electric signals and a fluctuation of ground level (i.e., return current through ground) come to be a function of the self inductance mentioned above, then it is proportional to the length of the bare probe. Therefore, in a case where the high speed signal higher than several hundreds MHz is applied to, there is necessitated a short probe being shorter than 10 mm. However, it is difficult and not realistic to manufacture the such spring probe.

Moreover, with the prior art 3, since the projecting probe tip is ordinarily formed with the wet etching, the effect of so-called side etching is small, therefore it is difficult to manufacture it within a short time and with high efficiency. Further, with this prior art 3, since the projecting probe tip is formed on the multi-layer print board, a softness thereof is lost, as the result, there is a risk that it gives injure onto the object to be tested, such as the semiconductor element, etc.

As is explained in the above, with the prior arts, there are never taken enough considerations on an aspect that the probe should be shorten in the length thereof so as to cope with the high speed signals higher than several hundreds MHz and it should be constructed with multiple pins for each one electrode so as to connect thereon with a light load and certainty, nor on an aspect of manufacturing it with ease and high efficiency.

SUMMARY OF THE INVENTION

An object according to the present invention, for dissolving the problems mentioned above, is to provide a probing device and a testing method, with which the probes can be connected with the each of the electrodes, being aligned on the object to be test with advances in the density and in the narrow pitch thereof, with a light load and with certainty, and further with which, the probes can be shorten in the length so as to enable transfer of the high speed signals of high frequency being higher than several hundreds MHz.

Further, another object according to the present invention is to provide a probing device and a testing apparatus, with which the probes can be connected with each of the electrodes, being aligned on the object to be test with advances in the density and in the narrow pitch thereof and being formed with solder bumps, with a light load and with certainty, and further with which, the probes can be shorten in the length so as to enable transfer of the high speed signals of high frequency being higher than several hundreds MHz.

And, further, other object according to the present invention is to provide a manufacturing method of the probing device, with ease and with high efficiency, with which the probes can be connected with each of the electrodes, being aligned on the object to be test with advances in the density and in the narrow pitch thereof and being formed with solder bumps, with a light load and with certainty, and further with which, the probes can be shorten in the length so as to enable transfer of the high speed signals of high frequency being higher than several hundreds MHz.

Moreover, a further other object according to the present invention is to provide a manufacturing method of a semiconductor element, with which the performance test can be conducted on the semiconductor element which necessitate an operation test with the high speed signals, with advances in the density and in the narrow pitch thereof, so as to enable the manufacturing of the semiconductor.

For achieving the above-mentioned object, according to the present invention, there is provided a probing device for electrically contacting with a plurality of electrodes aligned on an object to be tested so as to transfer electrical signal therewith, comprising:

a wiring sheet being formed by aligning a plurality of contact electrodes corresponding to each of said electrodes, each being formed with one or more projecting probes on one surface of an insulator sheet by etching thereof, while extension wiring for electrically connecting to said each of said contact electrodes being formed either on said one surface or the other surface opposing thereto of said insulator sheet; and means for giving contacting pressure for obtaining electrical conduction between said extension wiring and said object to be tested by contacting tips of said one or more of the projecting contact probes formed onto said each contact electrode through giving pressuring force between said wiring sheet and said object to be tested.

Also, according to the present invention, there is provided a probing device for electrically contacting with a plurality of electrodes aligned on an object to be tested so as to transfer electrical signal therewith, comprising:

a wiring sheet being formed by aligning a plurality of contact electrodes, corresponding to each of said electrodes, each being formed with projecting probe on basis of a conductor thin film formed on one surface of an insulator sheet of a polyimide film by etching thereof, while extension wiring for electrically connecting to said each of said contact electrodes being formed on basis of a conductor thin film formed on either said one surface or the other surface opposing thereto of said insulator sheet of the polyimide film; and means for giving contacting pressure for obtaining electrical conduction between said extension wiring and said object to be tested by contacting tips of said projecting contact probe formed onto said each contact electrode through giving pressuring force between said wiring sheet and said object to be tested.

Further, according to the present invention, there is provided a probing device for electrically contacting with a plurality of electrodes aligned on an object to be tested so as to transfer electrical signal therewith, comprising:

a wiring sheet being formed by aligning a plurality of contact electrodes, corresponding to each of said electrodes, each being formed with projecting probe on basis of a conductor thin film and a conductor plating film thereon formed on one surface of an insulator sheet of a polyimide film by etching thereof, while extension wiring for electrically connecting to said each of said contact electrodes being formed on basis of a conductor thin film formed on either said one surface or the other surface opposing thereto of said insulator sheet of the polyimide film; and means for giving contacting pressure for obtaining electrical conduction between said extension wiring and said object to be tested by contacting tips of said projecting contact probe formed onto said each contact electrode through giving pressuring force between said wiring sheet and said object to be tested.

Also, according to the present invention, in the probing device as mentioned in the above, wherein a solder bump is formed on the electrode aligned on the object to be tested, and electric conduction is obtained by encroaching the projecting probes formed on the contact electrode into the solder bump.

Further, according to the present invention, in the probing device as mentioned in the above, wherein a plurality of projecting probes are formed for each of said contact electrodes in said wiring sheet.

Further, according to the present invention, in the probing device as mentioned in the above, wherein a conductor film is bonded (or pasted) on the wiring sheet.

Further, according to the present invention, in the probing device as mentioned in the above, wherein the conductor thin film is a copper thin film in said wiring sheet.

Further, according to the present invention, in the probing device as mentioned in the above, wherein the conductor plating film is a nickel plating film in said wiring sheet.

Further, according to the present invention, in the probing device as mentioned in the above, wherein an element or parts are provided for adjusting impedance on a way of said extension wiring in said wiring sheet.

Further, according to the present invention, in the probing device as mentioned in the above, wherein the projecting probe is formed on each of the contact electrodes with shower etching in said wiring sheet.

Further, according to the present invention, in the probing device as mentioned in the above, wherein the projecting probe is formed on each of the contact electrodes on basis of the conductor plating film with shower etching in said wiring sheet.

Further, according to the present invention, in the probing device as mentioned in the above, wherein the projecting probe is formed on each of the contact electrodes on basis of the conductor plating film with a local plating in said wiring sheet.

Further, according to the present invention, in the probing device as mentioned in the above, wherein the projecting probe has a flat portion (approximately from 7 to 100 $\mu m^2$ in the area thereof) at tip thereof in said wiring sheet.

Further, according to the present invention, in the probing device as mentioned in the above, wherein the contact electrodes and the extension wiring are formed on the same surface of the insulator sheet in said wiring sheet.

Further, according to the present invention, in the probing device as mentioned in the above, wherein the extension wiring formed on the opposite surface of the contact electrodes and the contact electrodes are connected through a via hole formed on the insulator sheet in said wiring sheet.

Further, according to the present invention, in the probing device as mentioned in the above, wherein the extension wiring is covered with a protection layer in said wiring sheet.

Further, according to the present invention, in the probing device as mentioned in the above, wherein the contact probes are covered with a film of hard metal in said wiring sheet.

Further, according to the present invention, there is provided a testing apparatus for conducting test on an object to be tested by transferring and electric signal, comprising:

a wiring sheet being formed by aligning a plurality of contact electrodes corresponding to each of said electrodes formed on the object to be tested, each being formed with one or more projecting probes on one surface of an insulator sheet by etching thereof, while extension wiring being electrically connected to said each of said contact electrodes and being covered with a protection film is formed either on said one surface or the other surface opposing thereto of said insulator sheet;

positioning means for positioning said object to be tested at least flatly with respect to said wiring sheet;

means for giving contacting pressure for obtaining electrical conduction between said extension wiring positioned by said positioning means and said object to be tested by contacting tips of said one or more of the projecting contact probes formed onto said each contact electrode through giving pressuring force between said wiring sheet and said object to be tested; and a tester being electrically connected with the extension wiring extended in periphery portion of said wiring sheet, whereby the electrical signal is transferred from said tester to said object to be tested so as to conduct the test.

Also, according to the present invention, there is provided a testing apparatus for conducting test on an object to be tested by transferring and electric signal, comprising:

a wiring sheet being formed by aligning a plurality of contact electrodes, corresponding to each of said electrodes aligned on the object to be tested, each being formed with projecting probe on basis of a conductor thin film formed on one surface of an insulator sheet of a polyimide film by etching thereof, while extension wiring for electrically connecting to said each of said contact electrodes being formed on basis of a conductor thin film formed on either said one surface or the other surface opposing thereto of said insulator sheet of the polyimide film;

positioning means for positioning said object to be tested at least flatly with respect to said wiring sheet;

means for giving contacting pressure for obtaining electrical conduction between said extension wiring positioned by said positioning means and said object to be tested by contacting tips of said projecting contact probes formed onto said each contact electrode through giving pressuring force between said wiring sheet and said object to be tested; and a tester being electrically connected with the extension wiring extended in periphery portion of said wiring sheet, whereby the electrical signal is transferred from said tester to said object to be tested so as to conduct the test.

Further, according to the present invention, there is provided a testing apparatus for conducting test on an object to be tested by transferring and electric signal, comprising:

a wiring sheet being formed by aligning a plurality of contact electrodes, corresponding to each of said electrodes aligned on the object to be tested, each being formed with projecting probe on basis of a conductor thin film and a conductor plating film thereon formed on one surface of an insulator sheet of a polyimide film by etching thereof, while extension wiring for electrically connecting to said each of said contact electrodes being formed on basis of a conductor thin film formed on either said one surface or the other surface opposing thereto of said insulator sheet of the polyimide film;

positioning means for positioning said object to be tested at least flatly with respect to said wiring sheet; and a tester being electrically connected with the extension wiring extended in periphery portion of said wiring sheet, whereby the electrical signal is transferred from said tester to said object to be tested so as to conduct the test.

Further, according to the present invention, in the probing device as mentioned in the above, further comprising a support member for supporting said wiring sheet.

Further, according to the present invention, in the probing device as mentioned in the above, wherein said support member has a compliance mechanism.

Further, according to the present invention, in the probing device as mentioned in the above, wherein a buffer member is provided between said support member and the wiring sheet.

Further, according to the present invention, in the probing device as mentioned in the above, further comprising a wiring board connected to the extension wiring extended in the periphery portion of said wiring sheet, wherein between said extension wiring and said tester is connected through said wiring board.

Further, according to the present invention, in the probing device as mentioned in the above, wherein said positioning means is constructed with a frame-like member (a socket-like member) being provided, so that the object to be tested can be insert into a predetermined position with respect to the wiring sheet at the side of the contact electrodes of the wiring sheet.

Moreover, according to the present invention, there is provided a testing apparatus comprising:

a sample support portion for supporting an object to be tested;

at least one of a separated probe system, comprising: a wiring sheet being formed by aligning a plurality of contact electrodes, corresponding to each of said electrodes aligned on the object to be tested, each being formed with projecting probe on basis of a conductor thin film formed on one surface of an insulator sheet of a polyimide film by etching thereof, while extension wiring for electrically connecting to said each of said contact electrodes being formed on basis of a conductor thin film formed on either said one surface or the other surface opposing thereto of said insulator sheet of the polyimide film; and means for giving contacting pressure for obtaining electrical conduction between said extension wiring positioned by said positioning means and said object to be tested by contacting tips of said projecting contact probes formed onto said each contact electrode through giving pressuring force between said wiring sheet and said object to be tested; and a tester connected to said separated probe system for conducting the test.

Furthermore, according to the present invention, in the testing apparatus as mentioned in the above, wherein said separated probe system is mounted on a mother board and is connected to the tester through said mother board.

Also, according to the present invention, in the testing apparatus as mentioned in the above, wherein the projecting probes formed are covered with a film of hard metal.

And, also according to the present invention, there is provided a manufacturing method of a probing device being constructed with a wiring sheet for electrically contacting with a plurality of electrodes aligned on an object to be tested so as to transfer electrical signal therewith, comprising:

a first manufacturing step for preparing a sheet of insulator being formed with a conductor film on a surface thereof;

a second manufacturing step for forming an extension wiring from the conductor film of the sheet prepared in said first manufacturing step by patterning thereof; and a third manufacturing step for forming contact electrode by connecting a portion corresponding to said electrode in the conductor film of the sheet prepared in said first manufacturing step with the extension wiring formed with said second manufacturing step, by forming one or more of projecting contact probes with etching a surface layer at positions corresponding to said electrodes in said conductor film, and by patterning the portion on which said one or more of projecting probes are formed.

Further, according to the present invention, there is provided a manufacturing method of a probing device being constructed with a wiring sheet for electrically contacting with a plurality of electrodes aligned on an object to be tested so as to transfer electrical signal therewith, comprising:

a first manufacturing step for preparing a sheet of insulator (a polyimide film, etc.) being formed with a conductor film on a surface thereof;

a second manufacturing step for forming an extension wiring from the conductor film of the sheet prepared in said first manufacturing step by patterning thereof; and a third manufacturing step for forming the contact electrode by forming a plating film on the conductor film of the sheet prepared in said first manufacturing step, by connecting a portion corresponding to said electrode in the conductor film of the sheet prepared in said first manufacturing step with the extension wiring formed with said second manufacturing step, by forming one or more of projecting contact probes with etching a surface layer at positions corresponding to said electrodes in said plating film, and by patterning the portion on which said one or more of projecting probes are formed.

Furthermore, according to the present invention, in the testing apparatus as mentioned in the above, wherein the etching in said third manufacturing step is shower etching.

Furthermore, according to the present invention, in the testing apparatus as mentioned in the above, wherein a mask is formed with a dry film mask at the tips of the projecting probes when etching in said third manufacturing step.

And, according to the present invention, further there is provide a manufacturing method of a probing device being constructed with a wiring sheet for electrically contacting with a plurality of electrodes aligned on an object to be tested so as to transfer electrical signal therewith, comprising:

a first manufacturing step for preparing a sheet of insulator being formed with a conductor film on a surface thereof;

a second manufacturing step for forming one or more projecting probes by etching a surface layer at positions corresponding to said electrodes in the conductor layer of the sheet prepared in said first manufacturing step; and a third manufacturing step for connecting the conductor film of the sheet prepared in said first manufacturing step with said extension wiring, and by patterning the contact electrodes on which the one or more of the projecting probes are formed in said second manufacturing step.

Furthermore, according to the present invention, in the testing apparatus as mentioned in the above, wherein the etching in said third manufacturing step is shower etching.

Furthermore, according to the present invention, in the testing apparatus as mentioned in the above, wherein a mask is formed with a dry film mask at the tips of the projecting probes when etching in said third manufacturing step.

Furthermore, according to the present invention, there is provided a manufacturing method of a probing device being constructed with a wiring sheet for electrically contacting with a plurality of electrodes aligned on an object to be tested so as to transfer electrical signal therewith, comprising:

a first manufacturing step for preparing a sheet of insulator being formed with a conductor film on a surface thereof;

a second manufacturing step for forming extension wiring on the conductor film of the sheet prepared in said first manufacturing process by patterning thereof; and a third manufacturing step for forming contact electrodes by connecting a portion corresponding to said electrodes in the conductor film of the sheet prepared in said first manufacturing step with the extension wiring formed with said second manufacturing step, by patterning the portion corresponding to position corresponding to said electrodes in said conductor film, and by forming one or more projecting probes with local planting on each portion of the conductor films which are patterned.

Also, according to the present invention, in the testing apparatus as mentioned in the above, wherein the sheet prepared in said first manufacturing step is constructed with a polyimide film pasted with copper foil.

Further, according to the present invention, in the testing apparatus as mentioned in the above, wherein the one or more projecting probes formed in said third manufacturing step is covered with a film of hard metal.

Furthermore, according to the present invention, in the testing apparatus as mentioned in the above, wherein the plating film is that of nickel.

Furthermore, according to the present invention, in the testing apparatus as mentioned in the above, wherein the plating film is a local plating of nickel.

Furthermore, according to the present invention, there is provided a probing device for electrically contacting with a contact object so as to transfer an electrical signal, comprising: a plurality of contact probes for electrically contacting with the contact object; and extension wiring extended from each probe, wherein said probe is constructed with projections obtained by etching of a surface layer of a conductor film, and said projections is constructed by being connected to the extension wiring through remaining portions of the conductor film.

Furthermore, according to the present invention, there is provided a manufacturing method of a probing device for electrically contacting with a contact object so as to transfer an electrical signal, comprising: a step of forming via-holes on one surface of an insulator film on both surfaces of which are formed conductor films, being conducted with the extension wiring and the other surface thereof; a step of forming contact electrodes in use for contacting (contact electrodes) with the contact object by etching said conductor film on the other surface conducting with said extension wiring through said via-holes; and a step of forming projecting probes by etching the surface layer of the electrodes in use for contacting (contact electrodes).

Further, according to the present invention, in the above-mentioned probing device, there is further provided a wiring board on which is provided a wiring for transferring an electric signal, and the extension wiring is connected to the electrode of said wiring board.

Further, according to the present invention, in the above-mentioned probing device, there are provided a wiring board and a socket, wherein the extension wiring pulled out from the contact probes of the probing device is connected to the electrode of said wiring board, and said probes are connected to the electrodes of the semiconductor element mounted into said socket, thereby providing a testing apparatus for the semiconductor elements.

Further, according to the present invention, the semiconductor elements are manufactured by testing the performances or characteristics thereof with use of the above-mentioned testing apparatus.

As is explained in the above, according to the above construction, a large number of the probes can be arranged with high density and high accuracy, as the result, it is possible to cope with high density of the object to be tested. Further, it is possible to shorten (from 0.001 to 0.2 mm) the length of the probes, as the result, it is possible to realize a high-speed AC testing with the stabilized high-speed signals, which can be supplied to all over the semiconductor elements with small voltage fluctuation. With this, confirmation of the high-speed operation as well as detailed observation of output wave-forms can be achieved, then margin of the semiconductor elements can be grasped, thereby enabling a feedback to the design of the semiconductor elements with high efficiency.

BRIEF DESCRIPTION OF DRAWINGS

FIG. 1(a) is a cross-section view and FIG. 1(b) is a plane view thereof;

FIG. 2(a) is a cross-section view and FIG. 2(b) is a plane view thereof;

FIG. 3(a) is a cross-section view and FIG. 3(b) is a plane view thereon;

FIG. 12 is a cross-section view of showing a principle portion of a first embodiment of a testing apparatus for semiconductor element according to the present invention;

FIG. 16 is a perspective view of showing a wafer and a semiconductor element according to the present invention;

FIG. 17 is a cross-section view of showing a conventional testing probe; and

FIG. 18 is a top plane view of showing the conventional testing probe.

DETAILED DESCRIPTION OF PREFERRED EMBODIMENTS

Hereinafter, embodiments of a probing device and a manufacturing method thereof, as well as a testing apparatus and a manufacturing method of a semiconductor element according to the present invention will be fully explained by referring to the attached drawings.

An probing device having contact probes according to the present invention is for testing or inspecting the electric performance or property of each semiconductor element (a chip), by electrically connecting with a large number of electrodes formed on the semiconductor elements (chips) under the condition of a substrate or wafer. However, with the advance in the high density of the semiconductor element, also the density of the electrodes and the total number thereof are increased, and further is needed the testing of the electrical performance with the high speed signals of high frequency being higher than several hundreds MHz. Accordingly, the probing device according to the present invention has contact probes which enables the contacts on an object to be tested, such as the semiconductor element with high density, as well as with multi-points and with high density, and further enables the testing of the electrical performance with the high speed signals of high frequency being higher than several hundreds MHz by shortening the contact probe to be equal or less than 10 mm in the length.

Figure 1A:
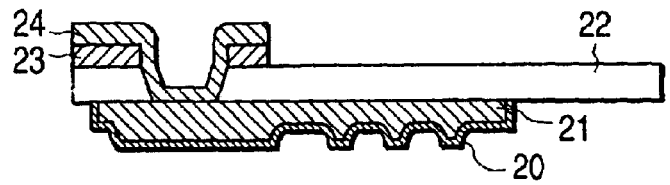
FIGS. 1(a) and 1(b) show a principle portion of a first embodiment of a wiring sheet constructing a probing device according to the present invention, in particular
Figure 1B:
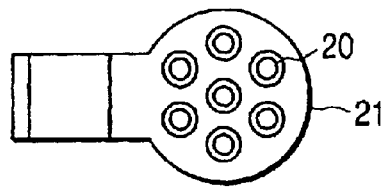
Figure 2A:
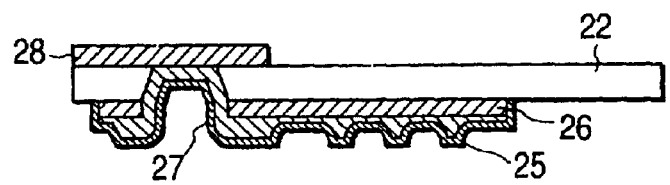
FIGS. 2(a) and 2(b) show a principle portion of a second embodiment of a wiring sheet constructing a probing device according to the present invention, in particular
Figure 2B:
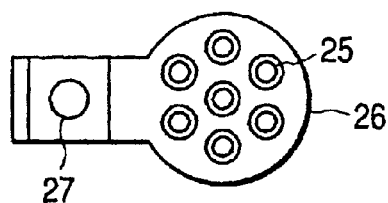
Figure 3A:
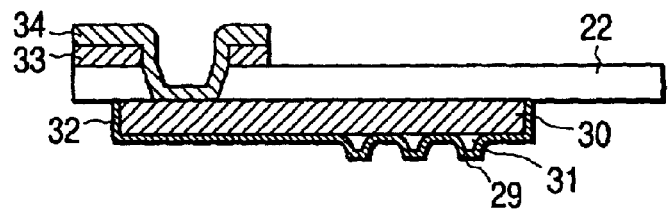
FIGS. 3(a) and 3(b) show a principle portion of a third embodiment of a wiring sheet constructing a probing device according to the present invention, in particular
Figure 3B:
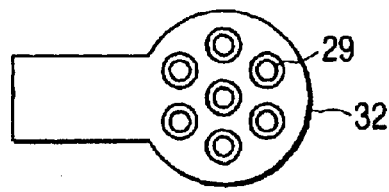

FIGS. 1 to 3 are diagrams of showing the cross-sections of the embodiments of the probing device according to the present invention.

Namely, FIG. 1 is a view of showing a principle portion of a first embodiment of the probing device according to the present invention. This probing device of the first embodiment comprises: a polyimide film 22, on one surface of which is formed an electrode 21 in use of contact on which a plurality of projecting tip portions 20, each having a flat portion from approximately several $\mu$m to 10 $\mu$m in the diameter (from 7 to 100 $\mu m^2$ or more or less, in the area), are planted or projected; an extension wiring 23 formed on the other surface thereof; and a solder film 24 for conducting between both of them. In a case of this first embodiment, as will be mentioned in the details later, it is manufactured on a basis of the polyimide film 22, both surfaces of which are formed or coated with thin films of copper, for example. Since the projecting tip portions 20 are formed with etching, the thickness of the copper thin film formed on the one surface is set to be about 25 $\mu$m, being thicker than that of the copper thin film formed the other (normally, about 18 $\mu$m), so as to perform the etching for forming the projecting tip portion 21 with ease. Of course, it is also possible to make the copper thin films being formed on both surfaces of the polyimide film 22 equal to be about 18 $\mu$m or about 25 $\mu$m in the thickness thereof. However, when the copper thin film is thicken in the thickness, it looses flexibility, but it does not matter so much.

FIG. 2 is a view of showing a principle portion of a second embodiment of the probing device according to the present invention. This probing device of the second embodiment comprises: a polyimide film 22, on one surface of which is formed an electrode 26 in use of contact, on which are planted or projected a plurality of projecting tip portions 25, each having a flat portion approximately from several $\mu$m to 10 $\mu$m in the diameter (from 7 to 100 $\mu m^2$ or more or less, in the area); a solder film 27 being formed on the same surface; and an extension wiring 28 formed on the other surface thereof. In a case of this second embodiment, as will be mentioned in the details later, it is also manufactured on a basis of the polyimide film 22, both surfaces of which are formed or coated with thin films of copper, for example. Further, in the case of this second embodiment, since the projecting tip portions 25 are formed with etching the solder film 27 formed on the copper thin film for connecting with the extension wiring 28, it is possible to use or adopt the polyimide film 22, both surfaces of which are formed with the ordinary thin copper films, being 18 $\mu$m in the thickness.

FIG. 3 is a view of showing a principle portion of a third embodiment of the probing device according to the present invention. The probing device of this third embodiment comprises: a polyimide film 22, on one surface of which is formed an electrode 32, being formed with a plurality of projecting tip portions 29, each being made from a plating material 31 on an electrode underground 30, being different from that of the electrode underground 30; an extension wiring 33 formed on the other surface of the polyimide film 22; and a solder film 34 for conducting between both of them. Also in the case of this third embodiment, as will be mentioned in more details later, it is manufactured on a basis of the polyimide film 22, both surfaces of which are formed or coated with thin films of copper, for example. The thickness of this copper thin film can be the same at both surfaces or can be thicker at the side on which the projecting tip portions 29 are formed.

In any one of the cases of the first through the third embodiments shown in FIGS. 1 through 3 mentioned in the above, the plurality of the minute projecting contact probes 20, 25 and 29 are formed with etching as an electrode, however only one contact probe can be formed for one electrode only when it is possible to obtain certain electrical connection with the electrode of the object to be tested therewith. However, when the plurality of the minute projecting contact probes 20, 25 and 29 are planted as one electrode, a certain electrical connection with the electrode of the object to be tested can be obtained. In particular, by forming the plurality of the minute projecting contact probes 20, 25 and 29 as one electrode, the electrical connection can be achieved with certainty, as shown in FIG. 12, only by applying contact pressure less than 10 mN per one pin (or one electrode), being greatly smaller than 300 mN, even in the case where on the electrode is formed the solder bump, the tip of which is not flat.

In any one of the cases of those first through the third embodiments shown in FIGS. 1 through 3, there is shown only one cross-section of the electrode 21, for simplification, however of course, actually a plurality of the electrodes 21 are arranged on the polyimide film 22, as will be mentioned later.

As was explained in the above, with the first through the third embodiments, as will be mentioned in more details later, the projecting tip portions 20, 25 and 29 are patterned with a photolithography technology, therefore they can be determined in the positions and the sizes with high accuracy (within several $\mu$m). Also, by forming the projecting tip portions 20, 25 and 29 with shower etching method for example, the shapes of those projecting tips shown can be obtained. Namely, the shape gradually diminishing the section area up to the tip can be formed depending upon necessity. Those features are common with the other embodiments.

In particular, the reason of shaping the tip of the contact probes 20, 25 and 29 pointed or tapered, according to the present invention, are as follows.

In case that an oxidized layer or an uneven solder bump is formed on the surface of the electrode of the object to be tested, the resistance becomes unstable when the contact probes are contacted thereon. When practicing the performance test on the semiconductor element with such the electrode, in order to obtain a stable resistance value being equal or less than 0.5 Ω in fluctuation of resistance value when contacted, it is necessary to maintain good contact by breaking the surface of the oxidized film on the surface of the electrode or the bump, with the tip portion of the contact probe. For that purpose, the each contact probe must be rubbed on the electrode with the contacting pressure being equal or greater than 300 mN per one pin (or per one electrode) when the tip of the contact probe is in semicircular shape. On a while, if the tip portion has the contact probes 20, 25 and 29 each having the flat portion of diameter from approximately several $\mu$m to 10 $\mu$m in range, as is mentioned in the above, conductance can be obtained with a stable contact resistance, only by pressing it, but without rubbing them onto the electrode, with the contact pressure being equal or less than 100 mN per one pin (or per one electrode). As a result of this, the contact on the electrode can be obtained with a low probe pressure, thereby protecting the electrode or circuit element thereunder from damage thereon. The pressure is applied to all of the contact probes, therefore it is possible to minimize the necessary force thereto. As the result, load endurance of a probe driver apparatus can be reduced in the testing apparatus equipped with this probing device, and a cost for manufacturing as well. Further, since it is enough to press the contact probes only in vertical direction, generation of electrode scraps caused by rubbing the contact probes onto the electrode also can be prohibited, thereby protecting the semiconductor element from contamination and short-circuiting between the electrodes thereof.

Next, a manufacturing process for forming the first embodiment of a wiring sheet, which constructs the probing device shown in FIG. 1, according to the present invention, will be explained by referring to FIG. 4. Namely, FIG. 4 shows a manufacturing process by the order of steps, in particular, for forming the tip portions 20 of the projecting contact probes from a thin film, in the manufacturing process for forming the first embodiment of the wiring sheet constructing the probing device shown in FIG. 1.

Figure 4A:
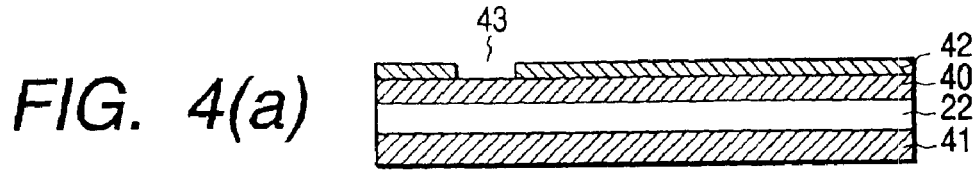
FIGS. 4(a)–4(g) show cross-section views illustrating a manufacturing process for forming the first embodiment of the wiring sheet constructing the probing device according to the present invention.

First, a step shown in FIG. 4(a) is executed. In this step, the polyimide film 22 is prepared, both surfaces of which are formed or covered with the thin copper films 40 and 41 of ordinary film thickness, i.e., 18 $\mu$m or 25 $\mu$m approximately. Photo-resist 42 is painted or pasted on the thin copper film 40 of the prepared polyimide film 22, on both surfaces of which are formed the thin copper films 40 and 41. Resist pattern is formed by exposing and developing it, and etching process is treated on it with use of the formed resist pattern, so as to remove the copper thin film 40 at the position 43 of a via hole (or bore) to be formed. Thereafter, the resist pattern is removed. However, by making the thickness of the thin copper film 41 thicker at about 25 $\mu$m, the shower etching shown in FIG. 4(e) can be performed easily, therefore it is possible to manufacture the tip portion 20 of the projecting contact probes, having the flat portion from approximately several $\mu$m to 10 $\mu$m in the diameter, with high accuracy. Here, the polyimide film 22 may be an insulating sheet (or insulating film) having flexibility therewith. Further, the polyimide film 22, both surfaces of which are formed with the thin copper films 40 and 41, may be an insulating sheet (or an insulating film) having flexibility, both surfaces of which are pasted with copper foil, or formed with the copper thin film through evaporation or plating.

Figure 4B:
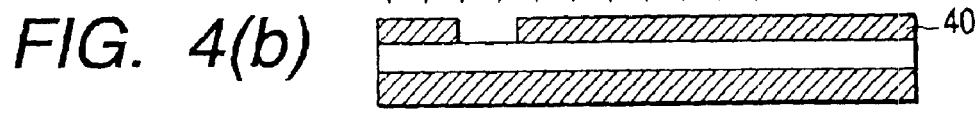

Next, the step shown in FIG. 4(b) is executed. This step is for removing a portion of the polyimide film 22 by laser machining process by using the above copper thin film 40 as the mask. As the laser 44 can be utilized a carbon dioxide laser, for example.

Figure 4C:
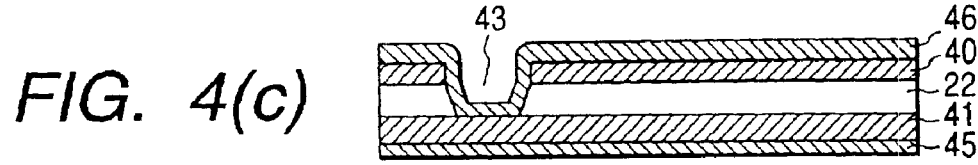

Next, the step shown in FIG. 4(c) is executed. This step is for forming a protection film 45 on the above copper thin film 41, and for forming a copper plating 46 on the wall surface of the via-hole (bore) where the polyimide film 22 is removed at the above via-hole forming position 43. However, for forming the copper plating 46, the wall surface of the via-hole may be treated or processed with chemicals, such as a tin-paradigm group, a carbon-graphite group, etc.

Figure 4D:

Next, the step shown in FIG. 4(d) is executed. This step is for forming the extension wiring 23 with the copper thin film 40 and the copper plating film 46, with use of the photo resist 47, by remaining the pattern being covered with the photo resist through etching of the copper thin film 40 as well as the copper plating film 46, and thereafter by removing the photo resist.

Figure 4E:
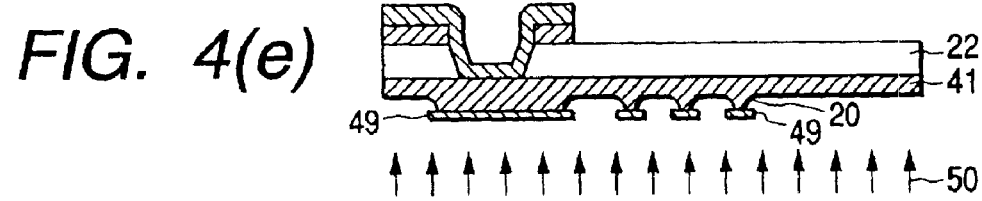

Next, the step shown in FIG. 4(e) is executed. This step is for forming the tip portion 20 of one or more of projecting contact probes, by use of photo resist masks 49 of a circular shape for example, which are formed at the positions for forming the tip portions 20 of the contact probes, through etching the copper thin film with using the side etching of the copper thin film 41. However, after the completion of the etching, the photo resist masks 49 is removed. As the applicable etching method, for example, the shower etching 50 can be applied with spraying enchant, such as a liquid of ferric chloride, a liquid of ammonium persulfate and (+) mercuric chloride, etc., which can etch the copper thin film, while the tip portions 20 of the projecting contact probes can be formed by promoting the side etching effect. However, when etching the copper thin film 41, the copper thin film 41 is etched in such a manner that there is remained the electrode 21 on which are formed the tip portions 20 of the contact probes. Further, it is needless to say, but the tip portions 20 of the contact probes can be formed by etching of the copper thin film 41 with using the photo resist mask 49 of a square or any shape. Further, in this step, the flat portion of approximately from several $\mu$m to 10 $\mu$m in the diameter can be formed at the each tip portion 20 of the projecting contact probes, by determining or selecting the size of the photo resist pattern in conformity with the amount of etching with the shower etching 50 in advance. In this manner, due to the fact that the flat portion can be formed approximately from several $\mu$m to 10 $\mu$m in the diameter at the tip portion 20 of the one or more of projecting contact probes, the conduction can be obtained with the stable contact resistance by only suppressing it with the contact pressure being equal or less than 100 mN per one pin (one electrode), even if the oxidized film or the uneven solder bump (approximately from 200 $\mu$m to 600 $\mu$m in the diameter) is formed on the surface of the electrode on the object to be tested. Further, since the photo resist mask 49 is formed by patterning with use of the photolithography technology, the tip portions 20 of the projection contact probes can be formed with high accuracy within around several $\mu$m in the position and the sizes thereof. The patterning of the photo resist mask 49 can be achieved by painting a photosensitive resist on it and by exposing and developing on the photosensitive resist painted. Further, also the patterning of the photo resist mask 49 can be achieved by pasting a film of photosensitive resist (i.e., a dry film resist, being made of the photosensitive resist formed into a film in advance) and by exposing and developing on the dry film resist pasted.

Figure 4F:
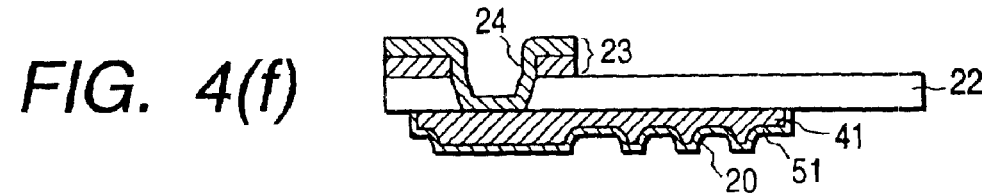

Next, the step shown in FIG. 4(f) is executed. This step is for forming the electrode 21 by etching the copper thin film 41 with using the photo resist 51 and thereafter by removing the photo resist 51.

Figure 4G:
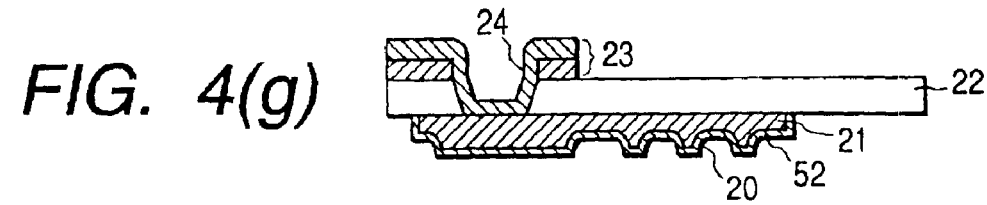

Next, the step shown in FIG. 4(g) is executed. This step is for forming the electrode 21 in use of contact, by plating a high hardness material 52, such as nickel, palladium, or rhodium, with the thickness of approximately from 0.3 $\mu$m to several $\mu$m, on the surface of the electrode 21 through such as an electric plating, non-electrolytic plating and so on, for improving a property of anti-friction or wear as well as a property of biting or encroaching into the electrode of the object to be tested. However, when plating with such the high hardness material 52, it may also plated on the extension wiring 23 formed on the opposite surface, thereby loosing the flexibility thereof. Therefore, a tape of such as polyimide or the like may be adhered on the surface of the wiring 23 before the plating, depending on the necessity thereof.

The first embodiment of the wiring sheet constructing the probing device shown in FIG. 1 can be manufactured through the respective steps shown in FIGS. 4(a) through 4(g) mentioned in the above.

Next, a manufacturing process for forming the second embodiment of a wiring sheet, which constructs the probing device shown in FIG. 2, according to the present invention, will be explained by referring to FIG. 5. Namely, FIG. 5 shows a manufacturing process by the order of steps, in particular, for forming the tip portions 25 of the projection contact probes from a plating film, in the manufacturing process for forming the second embodiment of the wiring sheet constructing the probing device shown in FIG. 2.

Figure 5A:
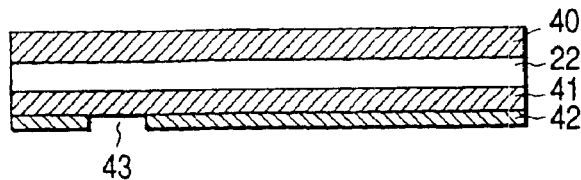
FIGS. 5(a)–(g) show cross-section views illustrating a manufacturing process for forming the second embodiment of the wiring sheet constructing the probing device according to the present invention.

First, a step shown in FIG. 5(a) is executed. In this step, in the same manner as in FIG. 4(a), the polyimide film 22 is prepared, on both surfaces of which are formed or covered with the thin copper films 40 and 41 of ordinary film thickness, i.e., approximately 18 $\mu$m or 25 $\mu$m. Photo-resist 42 is painted or pasted on the thin copper film 41 of the prepared polyimide film 22, on both surfaces of which are formed with the thin copper films 40 and 41. Resist pattern is formed by exposing and developing it, and etching process is treated on it with use of the formed resist pattern, so as to remove the copper thin film 40 at the position 43 of a via-hole (bore) to be formed. Thereafter, the resist pattern is removed.

Figure 5B:
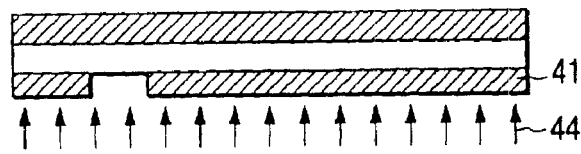

Next, the step shown in FIG. 5(b) is executed. This step is for removing a portion of the polyimide film 22 by laser machining process by using the above copper thin film 41 as the mask. As the laser 44 can be utilized a carbon dioxide laser, for example.

Figure 5C:
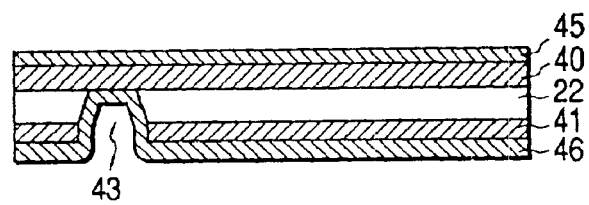

Next, the step shown in FIG. 5(c) is executed. This step is for forming a protection film 45 on the above copper thin film 40, and for forming a copper plating 46 with the thickness of approximately from several $\mu$m to 20 $\mu$m, on the wall surface of the via-hole where the polyimide film 22 is removed at the above via-hole forming position 43. However, for forming the copper plating 46, the wall surface of the via-hole may be treated or processed with chemicals, such as a tin-paradigm group, a carbon-graphite group, etc.

Figure 5D:
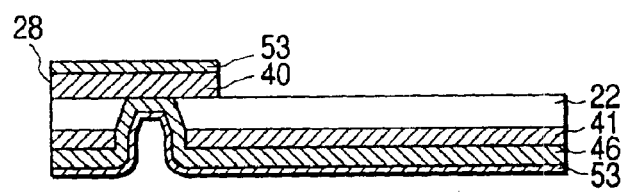

Next, the step shown in FIG. 5(d) is executed. This step is for forming the extension wiring 28, with use of the photo resist 53, by remaining the pattern covered with the photo resist 53 through etching of the copper thin film 40, and thereafter by removing the photo resist 53.

Figure 5E:
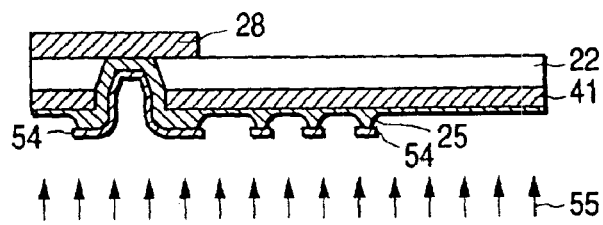

Next, the step shown in FIG. 5(e) is executed. This step is, in the same manner as in FIG. 4(e), for forming the tip portion 25 of one or more of projecting contact probes, by use of photo resist masks 54 of a circular, square or an arbitrary shape, which are formed at the positions for forming the tip portions 25 of the contact probe, through etching the copper plating 45 on the copper thin film 41 with use of the shower etching 55, etc., with utilizing the side etching on the copper plating 46. However, after the completion of the etching, the photo resist masks 54 is removed. In this step, the flat portion of approximately from several $\mu$m to 10 $\mu$m in the diameter can be formed at the each tip portion 25 of the projecting contact probes, by determining or selecting the size of the photo resist pattern in conformity with the amount of etching with the shower etching 55 in advance. In this manner, due to the fact that the flat portion can be formed approximately from several $\mu$m to 10 $\mu$m in the diameter at the tip portion 25 of the one or more of projecting contact probes, the conduction can be obtained with the stable contact resistance by only suppressing it with the contact pressure being equal or less than 100 mN per one pin (one electrode), even if the oxidized film or the uneven solder bump (approximately from 200 $\mu$m to 600 $\mu$m in the diameter) is formed on the surface of the electrode on the object to be tested. Further, since the photo resist 54 is formed by patterning with use of the photolithography technology, the tip portions 25 of the projection contact probes can be formed with high accuracy within around several $\mu$m in the position and the sizes thereof.

Figure 5F:
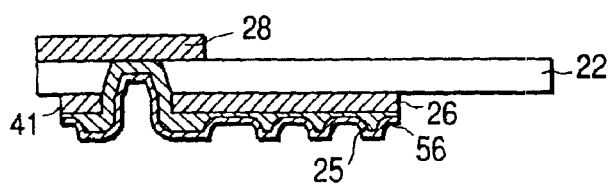

Next, the step shown in FIG. 5(f) is executed. This step is for forming the electrode 26 by etching the copper thin film 41 and the copper plating 46 thereunder with using the photo resist 56, and thereafter by removing the photo resist 56.

Figure 5G:
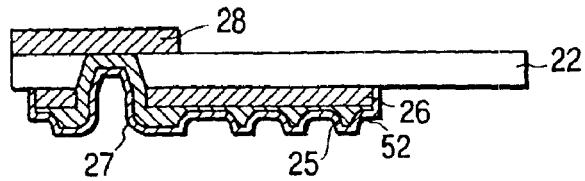

Next, the step shown in FIG. 5(g) is executed. This step is for forming the electrode 25 in use of contact, by plating a high hardness material 52, such as nickel, palladium, or rhodium, in the thickness of approximately from 0.3 $\mu$m to several $\mu$m, on the surface of the electrode 21 with such as an electric plating, non-electrolytic plating and so on, for improving a property of anti-friction or wear as well as a property of biting or encroaching into the electrode of the object to be tested. However, when plating with such the high hardness material 52, it may also plated on the extension wiring 28 formed on the opposite surface, thereby loosing the flexibility thereof. Therefore, a tape of such as polyimide or the like may be adhered on the surface of the wiring 28 before the plating, depending on the necessity thereof.

The second embodiment of the wiring sheet constructing the probing device shown in FIG. 2 can be manufactured through the respective steps shown in FIGS. 5(a) through 5(g) mentioned in the above.

Next, a manufacturing process for forming the third embodiment of a wiring sheet, which constructs the probing device shown in FIG. 3, according to the present invention, will be explained by referring to FIG. 6. Namely, FIG. 6 shows a manufacturing process by the order of steps, in particular, for forming the tip portions 29 of the projection contact probes from a plating film, in the manufacturing process for forming the third embodiment of the wiring sheet constructing the probing device shown in FIG. 3.

Fist, as shown in FIG. 6, the same steps as shown in FIGS. 4(a) through 4(d) are executed. Those steps are for forming the electrode underground 30 by etching the copper thin film 41 with using the photo resist 57 after forming the extension wiring 33, being formed with the copper thin film 40 as well as the copper plating film 46, with the same steps as shown in FIGS. 4(a) through 4(d).

Figure 6A:
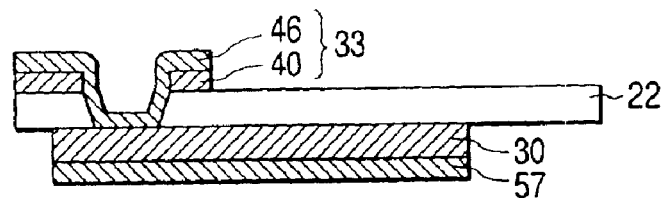
FIGS. 6(a)–6(d) show cross-section views illustrating a manufacturing process for forming the third embodiment of the wiring sheet constructing the probing device according to the present invention.
Figure 6B:
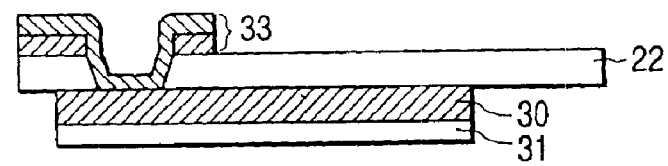

Next, the step shown in FIG. 6(b) is executed. This step is for plating a material being higher than the copper in hardness, on the surface of the electrode underground 30 with the thickness of approximately from several $\mu$m to 20 $\mu$m, through an electric plating. As the material of plating, nickel can be used. In this step, also if plating with such the material 31 harder than the copper, it may also plated on the extension wiring 28 formed on the opposite side, thereby loosing the flexibility thereof. Therefore, a tape of such as polyimide or the like may be adhered on the surface of the wiring 33 before the plating, depending on the necessity thereof.

Figure 6C:
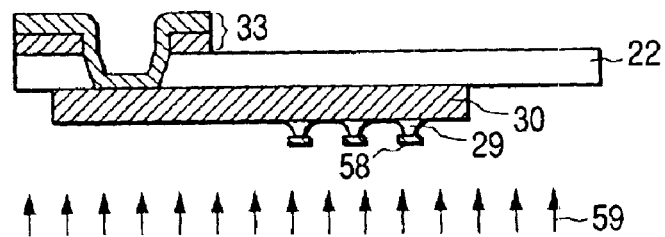

Next, the step shown in FIG. 6(c) is executed. This step is for forming the tip portion 29 of the one or more of the projecting contact probes, with use of the photo resist 58, by selectively etching the plating material 31 harder than the copper by a predetermined amount through the shower etching 59, with which the etchant suitable with the nickel is sprayed in like shower, and thereafter by removing the photo resist 58. In this step, the flat portion of approximately from several $\mu$m to 10 $\mu$m in the diameter can be formed at the each tip portion 29 of the projecting contact probes, by determining or selecting the size of the photo resist pattern in conformity with the amount of the selective etching (isotropic etching amount) with the shower etching 59 in advance. In this manner, due to the fact that the flat portion can be formed approximately from several μm to 10 μm in the diameter at the tip portion 29 of the one or more of projecting contact probes, the conduction can be obtained with the stable contact resistance by only suppressing it with the contact pressure being equal or less than 100 mN per one pin (one electrode), even if the oxidized film or the uneven solder bump (approximately from 200 μm to 600 μm in the diameter) is formed on the surface of the electrode on the object to be tested. Further, since the photo resist 58 is formed by patterning with use of the photolithography technology, the tip portions 29 of the projection contact probes can be formed with high accuracy within around several μm in the position and the sizes thereof.

Figure 6D:
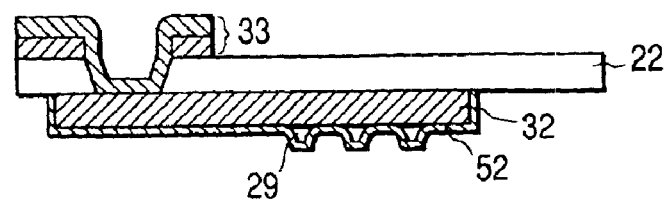

Next, the step shown in FIG. 6(d) is executed. This step is for forming the electrode 32 in use of contact, by plating the high hardness material 52, such as nickel, palladium, or rhodium, in the thickness of approximately from 0.3 μm to several μm, on the surface of the tip portions 29 of the contact probes formed with the electrode underground 30 and the plating material 31, through such as an electric plating, non-electrolytic plating and so on, for improving a property of anti-friction or wear as well as a property of biting or encroaching into the electrode of the object to be tested. However, when plating with such the high hardness material 52, it may also plated on the extension wiring 28 formed on the opposite surface, thereby loosing the flexibility thereof. Therefore, also a tape of such as polyimide or the like may be adhered on the surface of the wiring 28 before the plating, depending on the necessity thereof.

However, the step shown in FIG. 6(d) is not always necessary to be executed. This is because, the tip portion 29 can show a sufficient properties of anti-friction or wear and of biting or encroaching into the electrode of the object to be tested, if it is formed with the plating material 31, such as the nickel, etc.

The third embodiment of the wiring sheet constructing the probing device shown in FIG. 3 can be manufactured through the respective steps shown in FIGS. 4(a) through 4(d) and FIGS. 6(a) through 6(d) mentioned in the above. However, in this manufacturing process, since the plating material 31 such as the nickel or the like is formed on the copper thin film 30, the tip portions 29 of the one or more of contact probes can be produced easily with high accuracy, even if as the copper thin film 30 is applied the thin film having approximately 18 μm in the thickness, for example.

Next, a manufacturing process for forming an another embodiment of the wiring sheet constructing the probing device according to the present invention will be explained by referring to FIG. 7. FIG. 7 shows the manufacturing process for forming the tip portions of the projecting contact probes on a thin film of the another embodiment, in the order of steps thereof.

Figure 7A:
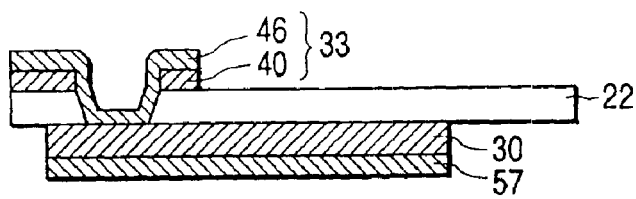
FIGS. 7(a)–7(d) show cross-section views illustrating a manufacturing process for forming another embodiment of the wiring sheet constructing the probing device according to the present invention.

First, as shown in FIG. 7(a), the steps same to those shown in FIGS. 4(a) through 4(d) (i.e., being same to that shown FIG. 6(a)) are executed. This step is for forming the electrode underground 30, after forming the wiring 33 formed with the copper thin film 40 as well as the copper plating film 46, by etching the copper thin film 41 with using the photo resist 57.

Figure 7B:
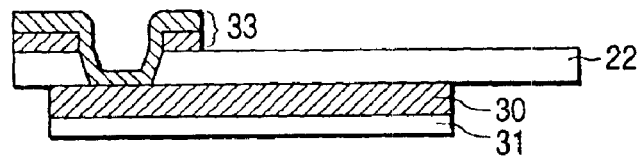

Next, the step shown in FIG. 7(b), being also the same shown in FIG. 6(b), is executed. This step is for plating the plating material 31 being higher than the copper in hardness on the surface of the electrode underground through the electric plating, etc. As the plating material, the nickel can be utilized, for example.

Figure 7C:
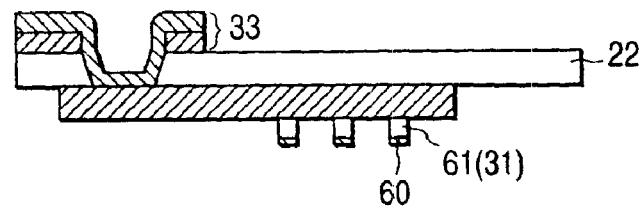

Next, the step shown in FIG. 7(c) is executed. This step is for forming the tip portion 61 of one or more of cylindrical contact probes of the plating material 31, by conducting selective etching (a method for etching the restricted materials only) on the plating material 31 with using a photo resist mask 60 into such as a circular shape. However, it is needless to say but, the tip potions 61 of the contact probes can be formed in a prism-like or rectangular column shape, through the selective etching with use of the photo resist mask 60 of a rectangular or an arbitrary shape. After completing the etching in this manner, the photo resist mask 60 is removed therefrom. In this step, it is also possible to form the flat portion of approximately from several μm to 10 μm in the diameter at the tip portions 61 of the projecting contact probes by determining or selecting the sizes of the photo resist pattern. In this manner, due to the fact that the flat portion can be formed approximately from several μm to 10 μm in the diameter at the tip portion 61 of the one or more of projecting contact probes, the conduction can be obtained with the stable contact resistance by only suppressing it with the contact pressure being equal or less than 100 mN per one pin (one electrode), even if the oxidized film or the uneven solder bump (approximately from 200 μm to 600 μm in the diameter) is formed on the surface of the electrode on the object to be tested. Also, since the photo resist 60 is formed by patterning with use of the photolithography technology, the tip portions 29 of the projection contact probes can be formed with high accuracy within around several μm in the position and the sizes thereof.

Figure 7D:
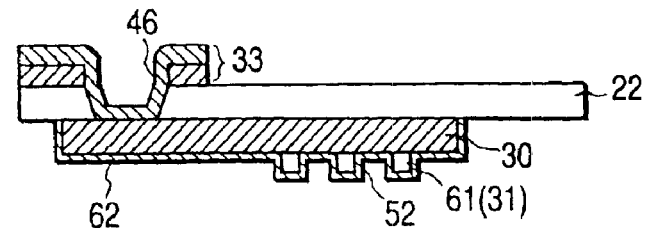

Next, the step shown in FIG. 7(d) is executed. This step is for forming the electrode 62 in use of contact, by plating the high hardness material 52, such as nickel, palladium, or rhodium, in the thickness of approximately from 0.3 μm to several μm, on the surface of the tip portions 61 of the contact probes formed of the plating material 31 and the electrode underground 30, through such as an electric plating, non-electrolytic plating and so on, for improving a property of anti-friction or wear and a property of biting or encroaching into the electrode of the object to be tested. However, when plating with such the high hardness material 52, it may also plated on the extension wiring 33 formed on the opposite surface, thereby loosing the flexibility thereof. Therefore, also a tape of such as polyimide or the like may be adhered on the surface of the wiring 33 before the plating, depending on the necessity thereof.

However, the step shown in FIG. 7(d) can be omitted to be executed. This is because, the tip portion 61 can show a sufficient properties of anti-friction or wear and of biting or encroaching into the electrode of the object to be tested, if it is formed with the plating material 31, such as the nickel, etc.

The probing device differing from the third embodiment can be manufactured through the respective steps shown in FIGS. 4(a) through 4(d) and FIGS. 7(a) through 7(d) mentioned in the above. However, the manufacturing process of this embodiment is different from the manufacturing process shown in FIG. 6, in the etching process on the plating material 31, such as of nickel, etc. With the manufacturing process of this embodiment (i.e., the selective etching), the cylindrical bodies 61 can be formed as the projecting contact probes, as the result, a one of the plurality of the cylindrical contact probes 61 can be formed on the electrode 62 with high density, while increasing the accuracy in the areas of the flat portions formed thereon.

Next, a manufacturing process for forming other embodiment of the wiring sheet constructing the probing device according to the present invention will be explained by referring to FIG. 8. FIG. 8 shows the manufacturing process for forming the tip portions of the projecting contact probes on the thin film of the other embodiment, in the order of steps thereof.

Figure 8A:
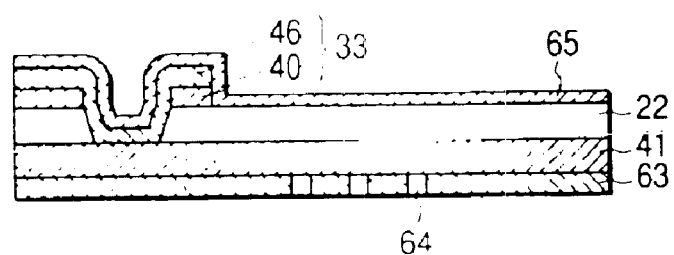
FIGS. 8(a)–(c) show cross-section views illustrating manufacturing process for forming another embodiment of the wiring sheet constructing the probing device according to the present invention.

First, in the steps being same to those shown in FIGS. 4(a) through 4(d), the extension wiring 33 is formed from the copper thin film 40 and the copper plating film 46. Then, as shown in FIG. 8(a), the via-holes are provided at the position where the tip portions of the contact probes are to be formed with using the photo resist 63 on the surface of the copper thin film 41. In the via-holes are plated with the plating materials 64 being higher than the copper in the hardness through the electric plating or the like, and the photo resist 63 is removed, thereby forming one or more of cylindrical contact probes 68. As the plating material 64 can be utilized such as the nickel plating. Further, on the surface of the wiring 33 is formed a protection film 65 depending upon the necessity thereof.

Figure 8B:
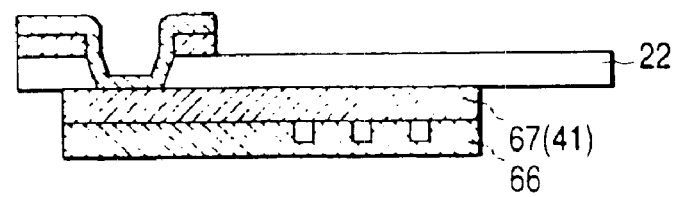
Figure 8C:
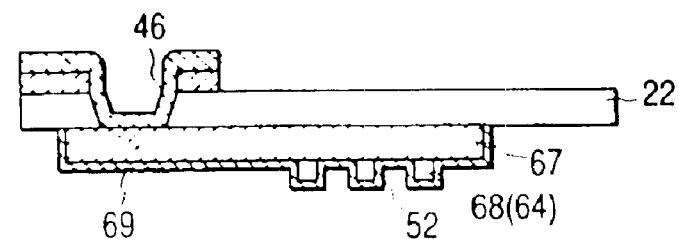
Figure 9A:
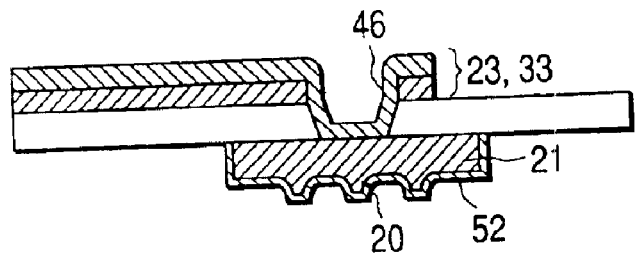
FIGS. 9(a)–(d) show cross-section views illustrating a manufacturing process for forming a further embodiment, in which electrodes in use of contact (contact electrodes) are connected with extension wiring at the same position thereof, in the wiring sheet constructing the probing device according to the present invention.
Figure 9B:
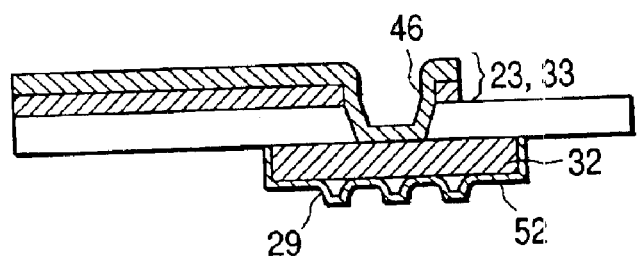
Figure 9C:
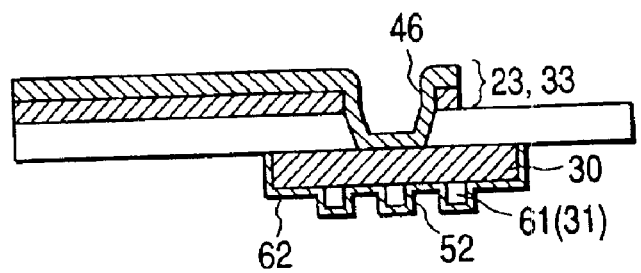
Figure 9D:
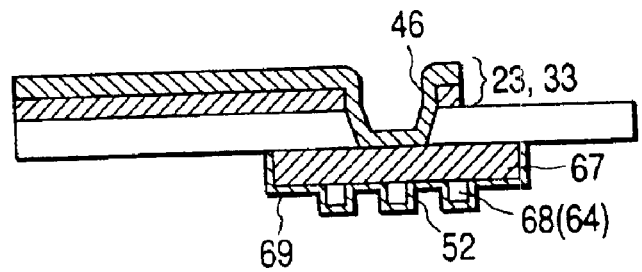

Next, as shown in FIG. 8(b), after removing the above-mentioned photo resist 63 and the protection film 65, the copper thin film 41 is etched with use of the photo resist 66, and then the photo resist 66 is removed, thereby forming the electrode 67 being formed with one or more of column-like contact probes 68.

Then, in the same manner as in FIG. 7(d), on the surface of the tip portions 68 of the contact probes made from the plating material 64 and the electrode 67, an electrode 69 for use of contact is formed by plating the material 52 of high hardness, such as palladium or rhodium or iridium.

The wiring sheet constructing the probing device differing from the third embodiment can be manufactured through the respective steps shown in FIGS. 4(a) through 4(d) and FIGS. 8(a) through 8(c). With this manufacturing process, the one or more of the column-like contact probes 68 can be formed on the copper thin plate 67 constituting the respective electrodes, with forming one or more of the via-holes on the photo resist 63 at the positions where the tip portions of the contact probes are to be formed and then by plating into the via-holes formed, as the result, the one or more of the column-like contact probes 68 can be formed on the electrode 67 with high density and with increase of the accuracy in the area of the flat portion formed thereon.

Further, with those embodiments shown in FIGS. 4 through 8, the positions for forming the copper plating portions 46 in use for forming the via-holes as well as the positions for forming the tip portions 21, 29, 61 or 68 of the contact probes are explained to be shifted to each other, in any one of them. However, as shown in FIGS. 9(a) through 9(d), it is needless to say, but that the tip portions can be formed at the same positions of those for forming the copper plating portions in use of forming the via-holes.

Further, in those embodiments shown in FIGS. 4 through 8, there is only disclosed a structure, wherein the copper plating portions 46 are formed in use for forming the via-holes, and one of the copper thin films on both surfaces of the polyimide film 22 is formed with the tip portions of the contact probes as the electrode in use of contact (contact electrode), while that on the other surface is used as the extension wiring, in any one of them. However, it is needless to say, but that the electrode in use of contact (the contact electrode) formed with the tip portions of the contact probes and the extension wiring as well, can be formed only from the copper thin plate on one side surface of the polyimide film 22. In this case, the electrode in use of contact (the contact electrode) formed with the contact probes and the extension wiring are formed on the same surface thereof.

Next, an embodiment of a manufacturing process for manufacturing the probing device, in which the contact electrode formed with the contact probes and the extension wiring are formed on the same surface, will be explained by referring to FIGS. 10 and 11.

Figure 10A:
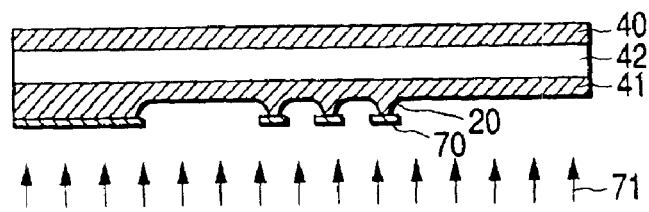
FIGS. 10(a)–(c) show cross-section views illustrating a manufacturing process for forming a another embodiment, in which contact electrodes and extension wiring are formed on the same plane, in the wiring sheet constructing the probing device according to the present invention.
Figure 10B:
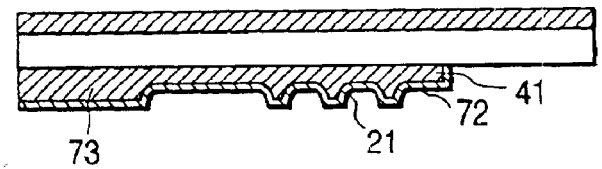
Figure 10C:
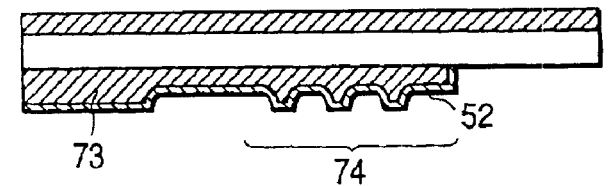

FIG. 10 shows the one embodiment of manufacturing process for manufacturing the probing device, in which the contact electrode formed with the contact probes and the extension wiring are formed on the same surface, in the order of the steps. First, as shown in FIG. 10(a), the copper thin film 41 is etched with use of the photo resist 70 by the shower etching 71, etc., thereby forming the tip portions 20 of the projecting contact probes. Then, as shown in FIG. 10(b), with use of the photo resist 72, the copper thin film 41 is etched, thereby forming the extension wiring 73. And, then as shown in FIG. 10(c), the material 52 of high hardness, such as the nickel, palladium or rhodium, is plated on the surface of the electrode 21, thereby forming the electrode 74 in use of contact (i.e., contact electrode). From the above, the electrode 21 being formed with one or more of the projecting contact probes 20 and the extension wiring 73 connected thereto can be formed on the same surface. In a case where the electrode 21 and the extension wiring 73 are formed on the same surface, in this manner, it is possible to provide a ground layer (or earth layer) 40 being formed by patterning of the copper thin film so as to oppose through the polyimide film 22 to the extension wiring 73 formed on the other surface.

Figure 11A:
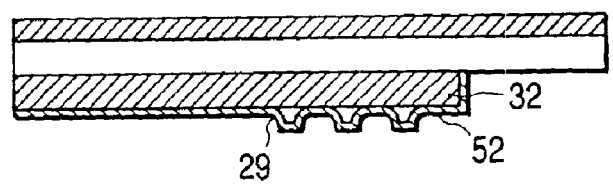
FIGS. 11(a)–(c) are cross-section views showing a principle portion of the embodiment, in which contact electrodes and extension wiring are formed on the same plane, in the wiring sheet constructing the probing device according to the present invention.
Figure 11B:
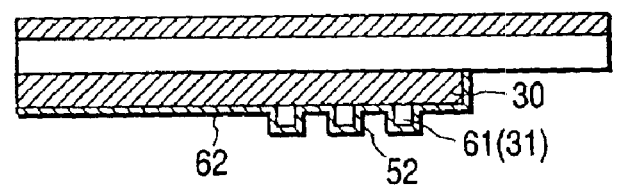
Figure 11C:
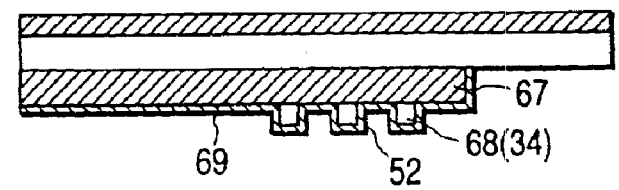

FIGS. 11(a) through (c) show further other embodiment, in which the copper plating process for use in forming the via-holes is omitted in the same manner as in the manufacturing process shown in FIG. 10, and the contact electrode and the extension wiring are formed on the copper thin film 41 by the manufacturing process shown in FIGS. 6 through 8.

However, if the copper thin film 40 for grounding is not necessary in the embodiments shown in FIGS. 10 and 11, it is enough to use a polyimide film painted or pasted only on one side surface.

Next, an embodiment of a testing apparatus with using the probing device, in which the tiny or minute projecting contact probes (20, 25, 29, 61, 68) are formed in the thin film according to the present invention will be explained by referring to FIG. 12. FIG. 12 is an explanatory view of showing a principle portion of a one embodiment of the testing apparatus according to the present invention.

In the present embodiment, the testing apparatus is constructed as a prober in use for a bare chip of the semiconductor element. This testing apparatus is constructed with a sample support system 100 for positioning and suppressing the object to be tested, a connecting device 110 for contacting with the object to be tested so as to transfer electric signals, and a tester 170 for conducting measurement. As the object to be tested therewith is targeted or aimed the semiconductor element (or chip) 2. On the surface of the semiconductor element 2, a plurality of electrodes 3 are formed aligning as external electrodes. In the present embodiment, on each electrode 3 is formed with the solder bump 6.

On the sample support system 100 is mounted the semiconductor element 2, in detachable. By entering the semiconductor element 2 into a frame 101, the semiconductor element 2 is positioned at a predetermined position, and thereafter by fixing an upper cover 104 on the frame 101 through a suppressing means 102, such as a spring or an elastic body, and a holding plate 103, the solder bumps 6 formed on the electrodes of the semiconductor 2 are suppressed onto contact probes 110*a* (20, 25, 29, 61, 68) having the projecting tip portions of the probing device mentioned above to be contact therewith. Those contact probes 110*a* are formed on the surface of the electrode 110*b* in use of contact (21, 26, 30, 32, 67, 74), and are connected through the extension wiring 110*c* (23, 28, 33) to connection electrodes 117*a* provide on a wiring board 117 by means of a solder 99, while the connection electrodes 117*a* are connected to the tester 170 not shown in the figure, in the present embodiment, through internal wiring 117*b*. However, the wiring board 117 also functions as a role of a supporting member (or a press member for pressing) for supporting the wiring sheet 110*d* constructing the probing device 110. Further, the wiring sheet 110*d* constructing the probing device 110 is constructed with the polyimide film (or the insulating sheet) 22 having electric non-conductance, the electrode 110*b* in use of contact (i.e., the contact electrode) being formed with the plurality of minute contact probes 110*a* aligned on the said polyimide film 22 corresponding to the electrodes 3 and 6 of the semiconductor 2, and the extension wiring 110*c* connected to the said electrodes 110*b*.

However, depending upon the necessity, a buffer member 118, such as a silicon sheet may be provided for moderating or softening an impact being applied directly under the wiring sheet 110*d*, on which the contact probes 110*a* and the extension wiring 110*c* of the probing device 110 are formed, so as to protect the substrate, in which the semiconductor elements 2 are formed, from the damages thereof. Further, an element or a parts 119, such as a resistor or a capacitor for adjusting the impedance, may be on the way of the extension wiring 110*c* so as to transfer the signals. Furthermore, with the provision of the ground layer (the earth layer) of the copper thin film or the like on the surface of the polyimide film (insulator sheet) 22 opposing to the extension wiring 110*c*, it is also possible to adjust the impedance by changing the extension wiring 110*c* in the line width thereof and/or the polyimide film in the thickness thereof, etc., as well as to prevent the generation of noises.

As is explained in the above, the certain electrical connection can be obtained, by biting or encroaching the plurality of the minute contact probes 110*a* (20, 25, 29, 61, 68) which are formed on the electrode 110*b* (21, 26, 30, 32, 67, 74) arranged corresponding to the respective electrodes 3 and 6, into the solder bumps 6 of the each electrode aligned on the semiconductor element 2, with only suppressing the semiconductor element 2 at the low load (i.e., the pressure force smaller than 100 mN per one electrode) through the suppressing means 102. Further, since the length of the plurality of the minute contact probes 110*a* (20, 25, 29, 61, 68) formed on the probing device 110 can be shorten at approximately from 0.001 mm to 0.2 mm, the high speed signals being higher than a several hundreds MHz can be transferred. While, in the case where the solder bump 6 is approximately from 200 to 600 $\mu$m in the diameter thereof, the minute contact probes 110*a* (20, 25, 29, 61, 68) can be formed from about 5 to 7 in the number for each one of the electrodes, as shown in FIGS. 1 through 3.

Figure 13:
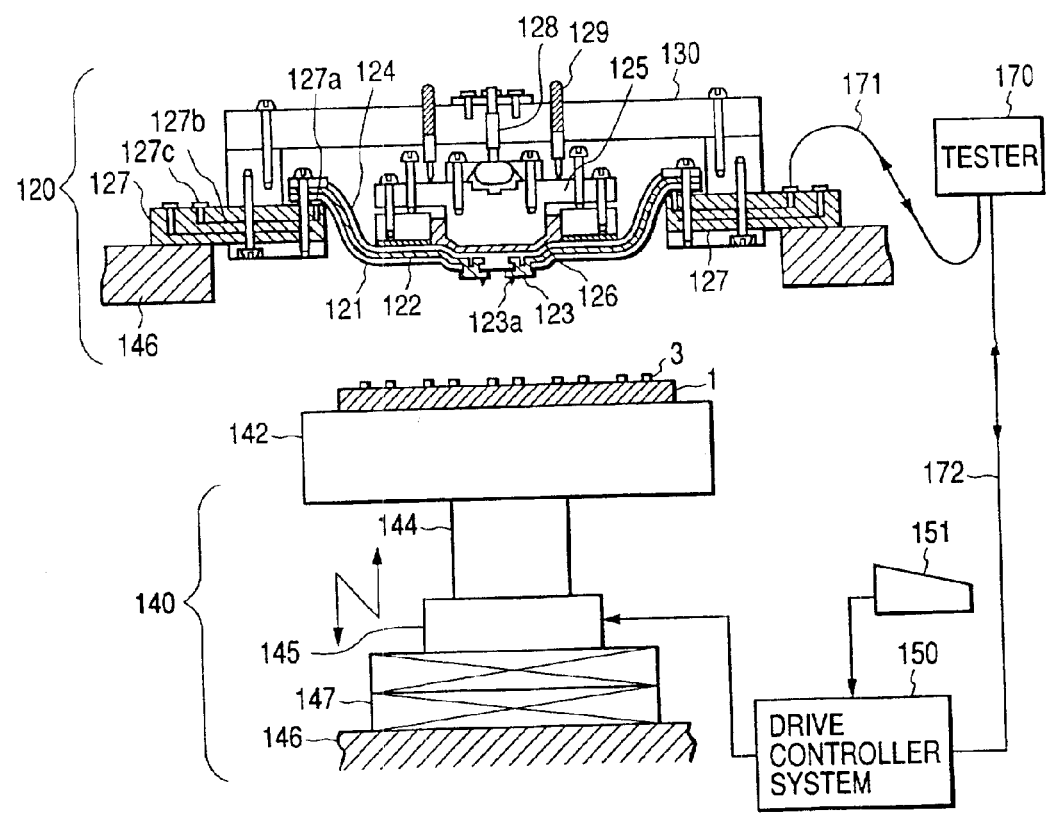
FIG. 13 is a cross-section view of showing a principle portion of a second embodiment of the testing apparatus for semiconductor element according to the present invention.

Next, an another embodiment of the testing apparatus with using the probing device constructed with wiring sheet, in which the minute projecting contact probes (20, 25, 29, 61, 68) are formed in the thin film according to the present invention will be explained by referring to FIG. 13. FIG. 13 is an explanatory view of showing a principle portion of the another embodiment of the testing apparatus according to the present invention.

In the present embodiment, the testing apparatus is constructed as a wafer prober in manufacturing process of the semiconductor element. This testing apparatus is constructed with a sample support system 140 for supporting the object to be tested, a probe system 120 for transferring the electrical signals by contacting with the object to be tested, a drive control system for controlling the operations of the sample support system 140, and a tester 170 for making measurement. As the object to be tested therewith is targeted or aimed the respective semiconductor element (or chip) 2 on a wafer 1. On the surface of the semiconductor element 2, a plurality of electrodes 3 are formed aligning as external electrodes.

The sample support system 140 is constructed with a sample support 142 being provided in almost horizontal, on which the wafer 1 is mounted in detachable manner, an elevating axis 144 vertically positioned for supporting the sample support 142, an elevating driver portion 145 for driving the elevation of the elevating axis 144, and a X-Y stage 147 for supporting the elevating driver portion 145. The X-Y stage 147 is fixed on a housing or case body 146. The elevating driver portion 145 is constructed with a stepping motor or the like, for example. By combining the moving operation within a horizontal plane of the X-Y stage 147 and the vertical movement with the elevating driver portion 145, the positioning operation of the sample support 142 is carried out in the horizontal and vertical directions thereof. Also, in the sample support 142 is provided a rotation mechanism not shown in figure, thereby enabling a displacement of the sample support 142 in a rotational direction within a horizontal plane.

Above the sample support 142 is positioned a probe system 120. Namely, the electrode 123 in use of contact (i.e., the contact electrode) formed with one or more of the contact probes 123*a* and the wiring board 127 are positioned horizontally opposing to the sample support 142. The wiring sheet 121 constructing the probing device is manufactured by forming the contact electrode 123 (21, 26, 30, 32, 67, 74) being formed with the one or more of the minute contact probes 123*a* (20, 25, 29, 61, 68) which are aligned corresponding to the respective electrodes 3, on the insulator sheet 22 of such as the polyimide film, etc., and is connected to connection electrodes 127*a* of the wiring board 127 through the extension wiring 122 (22, 28, 33) being connected to each of the above contact electrodes 123 (21, 26, 30, 32, 67, 74) and extending to the periphery of the insulator sheet 22. On the other side of the wiring sheet 121 including the extension wiring 122 (22, 28, 33) is formed a polyimide protection film 124, with which a pressing plate 125 is connected through a buffer member (buffer layer) 126, such as a silicon rubber. The holding plate 125 (also functions as a supporting plate for support) is connected to the wiring board 127 through a base board 130 fixed with a center pivot 128 and spring probes 129, therefore the holding plate 125 can displace freely so as to constitute a compliance mechanism. Each of the contact electrodes 123 (21, 26, 30, 32, 67, 74), each being constructed with the electrode (21, 26, 30, 32, 67, 74) on which the one or more minute contact probes (20, 25, 29, 61, 68) are formed, is connected to the connection electrode 127*a* provided on the wiring board 127 through the extension wiring 122. Further, with the provision of the ground layer (earth layer) on the surface of the polyimide film (insulator sheet) opposing to the extension wiring 122, the impedance can be adjusted by changing the line width of the extension wiring 122 and/or the film thickness of the polyimide film, etc., and it is also possible to prevent the generation of noises.

Above the sample support 142 is positioned the probe system 120. Namely, the contact electrode 123 being formed with the contact probes 123a (21, 26, 30, 32, 67, 74) and the wiring board 127, are in a position opposing to the sample support 142 horizontally. The contact electrode 123 being formed with the one or more of contact probes 123a (21, 26, 30, 32, 67, 74) is connected to the connection electrode 127a provided on the wiring board 127. This connecting electrode 127a is connected to a tester 170 through a cable 171 which is connected to the connection terminal 127c being connected thereto through an internal wiring 127b.

A drive controller system 150 is connected to the tester 170 through a cable 172. The drive controller system 150 sends control signals to the respective actuators of driver portions of the sample support system 140 so as to control the operations thereof. Namely, the drive controller system 150 comprises an internal computer, and controls the operations of the sample support system 140 responding to a progress information in the testing operation transmitted from the tester 170 through the cable 172. Further, the drive controller system 150 comprises an operation portion 151, through which can be accepted various kinds of instruction relating drive control, including such as an instruction of a manual operation.

Hereinafter, an operation of the probing device according to the present embodiment will be explained. On the sample support 142 is fixed the wafer 1, and then, by using the X-Y stage (positioning means) 147 and the rotation mechanism, the electrodes formed on the semiconductor elements 2 on the wafer 1 are positioned just under the contact electrode 123 of the probe system 120 [i.e., the electrode 123 in use of contact (21, 26, 30, 32, 67, 74), being formed with the one or more of the minute contact probes 123a (20, 25, 29, 61, 68)]. Thereafter, by elevating the sample support 142 up to a predetermined height with operation of an elevator drive portion 145 of the drive controller system 150, each of the tips 123a [i.e., the minute contact probes (20, 25, 29, 61, 68)] of the plurality of contact electrode 123 (21, 26, 30, 32, 67, 74) is contacted with the each of the plurality of electrodes 3 on the targeted semiconductor element 2 with a predetermined pressure. Under this condition, through the cable 171, the connection terminal 127c, the internal wiring 127b, the extension wiring 122 and the contact probe 123, supply of an operation electric power and transfer of operation testing signals are performed between the semiconductor elements 2 on the wafer 1 and the tester 170, so as to discriminate good or bad of the semiconductor elements in the operational performances thereof. A series of operations mentioned in the above is practiced on each of the plural semiconductor elements 2 formed on the wafer 1, and the discrimination between good or bad in the operational performances is conducted.

Next, an explanation will be given, by referring to FIGS. 14 and 15, on an another embodiment of the testing apparatus for semiconductor element with use of the probing device being constructed with the wiring sheet of the thin film on which are formed the projecting contact probes (20, 25, 29, 61, 68).

Figure 14:
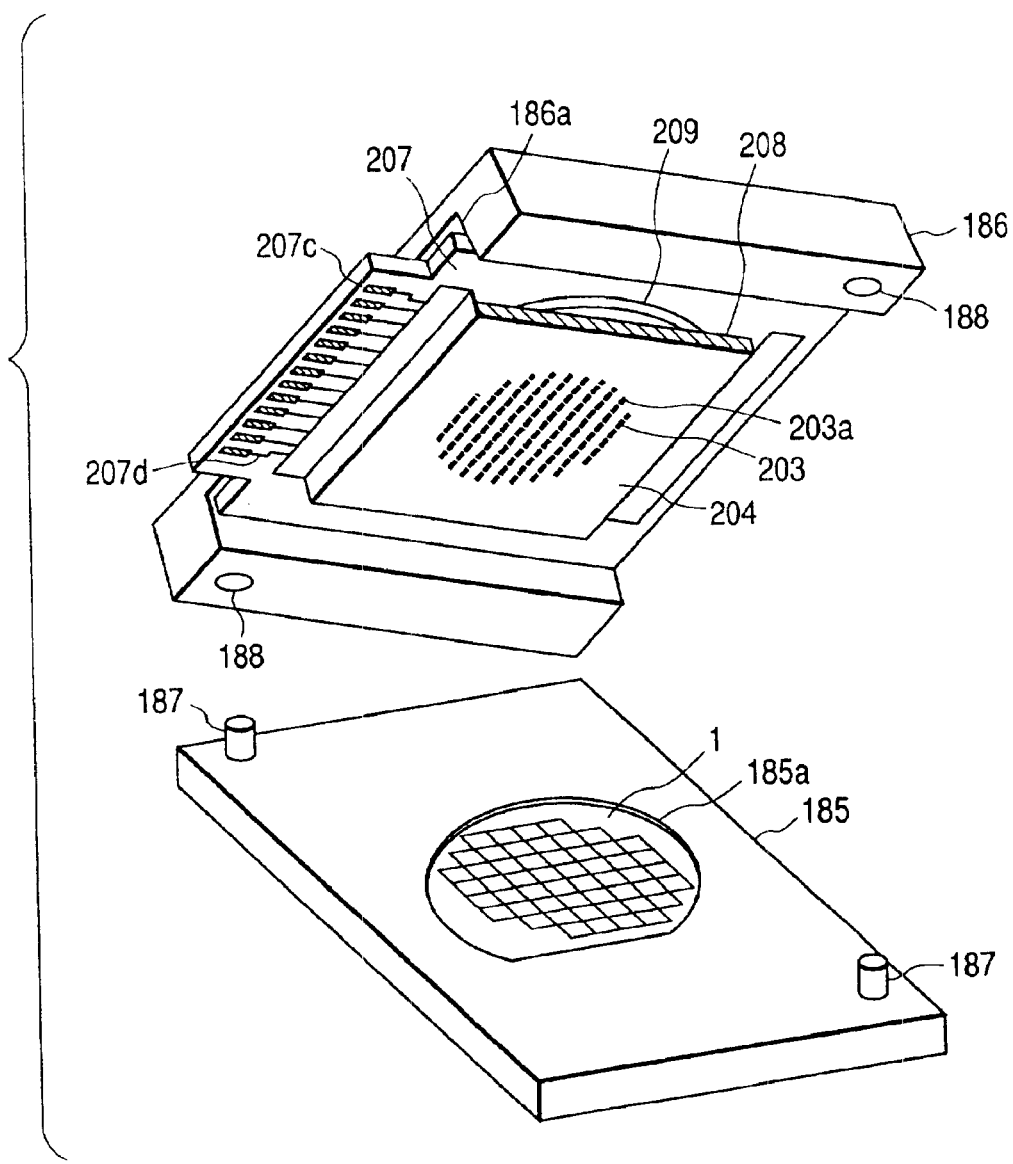
FIG. 14 is a cross-section view of showing a principle portion of a separated probe of the testing apparatus according to the present invention.
Figure 15:
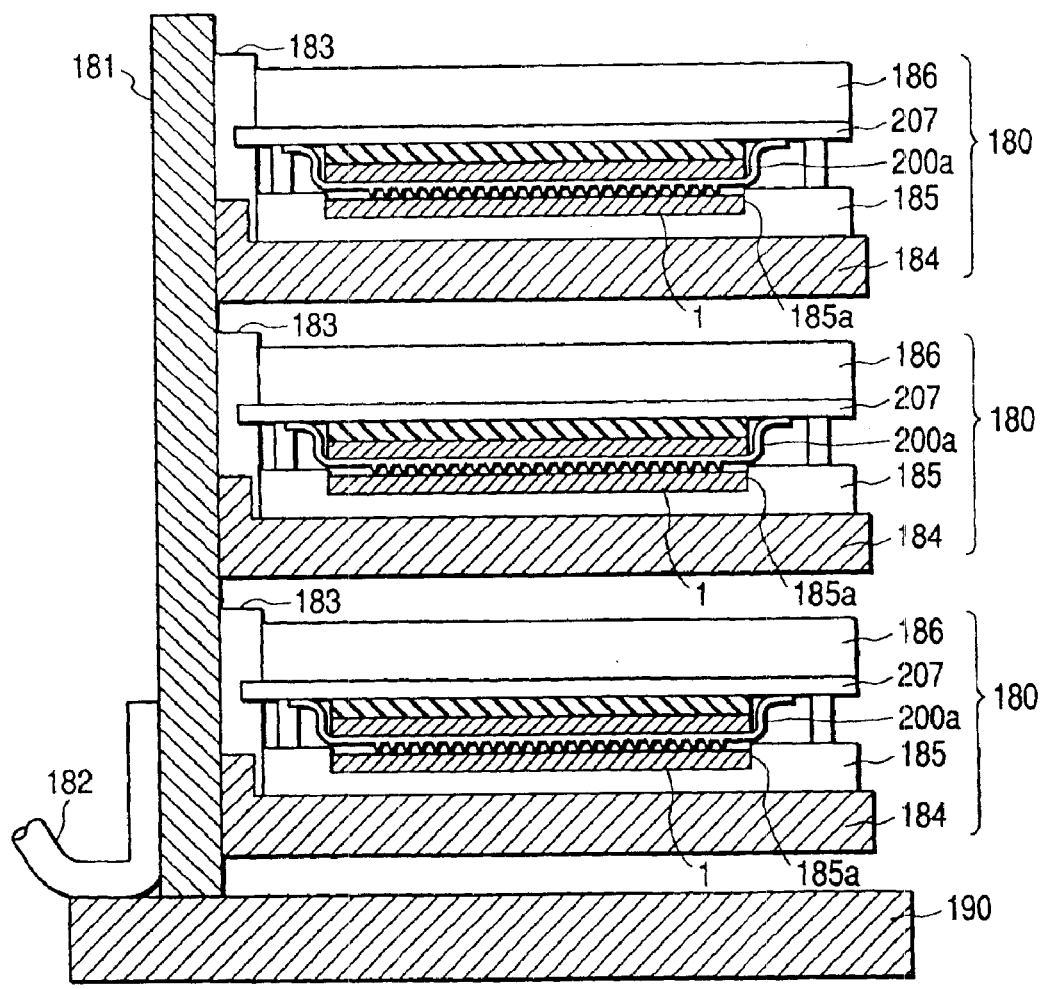
FIG. 15 is a cross-section view of showing the embodiment of the testing apparatus with use of the separated probe shown in FIG. 14.

FIG. 14 is a perspective view of showing a principle portion of the testing apparatus for testing on performance of the semiconductor elements, with use of the probing device formed with the projecting probes on the thin film according to the present invention, and FIG. 15 is a cross-section view of the testing apparatus for the semiconductor elements shown in FIG. 14.

The apparatus of the present embodiment is constructed as a wafer prober, with which a testing electric signal is applied to the semiconductor element so as to practice the performance test thereof. Further, with the present embodiment, the performance test of a plurality of the wafers 1 can be practiced at once. Namely, the present embodiment is constructed with, as shown in FIG. 15, a mother board 181 vertically attached to a supporting member 190, and a plurality of separated probe systems 180 which are attached to the mother board 181 perpendicular thereto, i.e., in parallel to the above supporting member 190.

The mother board 181 has connectors 183 provided for each of the probe systems 180, and a cable 182 which is connected to the above connectors through the mother board 181. The cable 182 is, though not shown in the figure in the present embodiment, connected to a tester being same to the tester 170 shown in the above FIG. 13.

The separated probe system 180 is provided for each one of the objects to be tested. This separated probe system 180 has a probing device 200a according to the present invention, a wiring board 207 on which the probing device 200a is fixed, a wafer supporting board 185 for supporting the wafers 1 thereon, i.e., the objects to be tested, a support board 184 on which the supporting board 185 is mounted, and for attaching the separated probe system 180 itself to the mother board 181, and a holding plate 186 (also achieving the role of holding the wiring sheet 121 in the same manner as the wiring board 117 shown in FIG. 12) for abutting the above probing device 200a onto the wafer 1.

The respective portions located above the wafer supporting board 185 are so constructed as shown in FIG. 14. Namely, the wafer supporting board 185 is formed from a metal plate, for example, and has a recess portion 185a for receiving the wafer 1 in detachable manner and a knock pin 187 for positioning.

A wiring sheet 200a constructing the probing device is constructed with an insulator film 204 (22) and a group of the contact probes 203 formed thereon [i.e., a group of the contact electrode 203 (21, 26, 30, 32, 67, 74) being formed with the one or more of minute projecting contact probes 203a (20, 25, 29, 61, 68)], a buffer member (buffer layer) 208, and a substrate 209. The wiring sheet 200a constructing the probing device is mounted on the wiring board 207, and the wiring (23, 28, 33) being pulled out from each of the contact probes 203 [i.e., the contact electrode 203 (21, 26, 30, 32, 67, 74) being formed with the one or more of minute projecting contact probes 203a (20, 25, 29, 61, 68)] is connected through the wiring 207d to the connector terminal 207c. This connector terminal 207c is so constructed to be inserted into the above connector 183.

Above the wiring sheet 200a constructing the probing device, the holding plate 186 is mounted. This holding plate 186 is shaped channel-like, and in this channel 186a is received the wiring board 207. Further, in the periphery of this holding plate 186 are provided holes 188 for insertion of the above knock pins (positioning means) 187.

Next, a measuring operation of the present embodiment will be explained by referring to FIG. 14.

In the recess portion 185a of the wafer support board 185 is fixed a mounting board on which the wafer 1 is mounted, and then, by using the knock pin 187, each one of the electrodes formed on the wafer 1 is positioned just under the each of the contact probes 203 [i.e., the contact electrode 203 (21, 26, 30, 32, 67, 74) being formed with the one or more of minute projecting contact probes 203a (20, 25, 29, 61, 68)], and is contacted with the targeted electrode 3 among the plurality of electrodes with a predetermined pressure. Under this condition, through the cable 182, the mother board 181, the connector 183, the wiring board 207, the extension wiring (23, 28, 33) formed on the insulator sheet (the insulator film) 204 (22) and the connector terminal 203, supply of electric power and transfer of operation test signal are conducted between the semiconductor elements formed on the wafer 1 and the tester, thereby discriminating good or bad of the semiconductor elements in the operational performances thereof. A series of operations mentioned in the above is practiced on each of the plural semiconductor elements 2 formed on the wafer 1, and the discrimination between good or bad in the operational performances is achieved.

However, it is also possible to use the apparatus shown in FIG. 15 as a so-called burn-in testing apparatus for practicing the performance test of the semiconductors, by giving electrical and thermal stresses under the condition of high temperature, being located in a homoiothermal reservoir. Further, it is needless to say, but that it can be used as the testing apparatus for semiconductors by connecting the separated probe system as one unit to the tester. In such the instance, if the insulator sheet is formed with the polyimide film, it can endure under the such high temperature.

As is fully described in the above, according to the present invention, there is realized a probing device and a testing apparatus, with which certain connections can be obtained with the respective electrodes aligned on the object to be tested even with a light load, and further transfer of the high speed signals can be obtained with being higher than several hundreds MHz in the frequency, with the probes shortened.

Further, according to the present invention, there is realized a probing device and a testing apparatus, with which certain and stabilized connections can be obtained with the respective electrodes formed with the solder bumps aligned on the object to be tested even with a light load, and further transfer of the high speed signals can be obtained with being higher than several hundreds MHz in the frequency with the probes shortened.

Furthermore, according to the present invention, it is possible to position a large number of the minute projecting probes with high density and high accuracy by etching the surface layer of the conductive layer, thereby, as the result, obtaining an effect that it is possible to cope with the high density on the object to be tested, as well as that the disturbance of the high speed signals can be reduced by forming the probes short (approximately from 0.001 to 0.2 mm) in the length.

Furthermore, according to the present invention, it is possible to contact the minute and high density projecting probes being formed by etching the surface layer of the conductive film, upon all of the surface electrodes on the semiconductor element of high density, multi-electrodes, and narrow pitch, as the result of this, it is possible to realize a high-speed AC testing with the stabilized high-speed signals, which can be supplied to all over the semiconductor elements with small voltage fluctuation. Namely, confirmation of the high-speed operations of the semiconductor elements and detailed observation of output wave-forms are available, therefore the characteristic margins of the semiconductor elements can be obtained, thereby enabling the feedback of high efficiency to designing of the semiconductor elements.

Further, according to the present invention, the side etching can be executed effectively on the surface layer of the conductive film, in particular with the shower etching, as the result of this, it is possible to form the large number of the projecting probes with high density, each of which has a flat portion of approximately from several $\mu$m to 10 $\mu$m in the diameter (i.e., from 7 to 100 $\mu M^2$ in the area) at the tip and is short (approximately from 0.001 to 0.2 mm) in the length. As the result of this, it is possible to realize the testing under the stabilized operation conditions with the voltage which can be supplied to all over the semiconductor elements with small voltage fluctuation, by contacting all pins with the surface electrodes of the semiconductor element of the narrow pitch.

Moreover, according to the present invention, with the provision of the buffer member, it is possible to absorb variety in the distance between the electrode and the probe. Namely, by selecting the material, the film thickness and the modulus of elasticity of the buffer layer appropriately, the elasticity of the contact probes can be set at an appropriate value so that they do not give any injury or damages on the electrodes or the active elements just thereunder when they are contacted. Further, if there are somewhat step-wise portions on the target electrodes of contacting, the contact at the predetermined force can be obtained through the flexibility of the insulator sheet and the elasticity of the buffer member. For exchanging the contact electrode pattern, it can be easily coped with by only replacing the etching pattern.

By using the material being usable under high temperature, such as the polyimide, as the material of the insulator sheet, the testing of operations of high temperature can be obtained. In a case where the object to be tested is the semiconductor elements of the silicon or the like, by fixing the above insulator film formed with the probes on the silicon substrate, it is possible to realize the probing device having small displacement due to the difference in a linear expansion rate, thereby enabling the testing under the high temperature with ease, even if it is in the condition of the wafer, for example.

Accordingly, it is possible to obtain the operation test with the high-speed signals, with the ultra multi-pins of high density targeting for contacting with the electrodes of the semiconductor element, and it is also possible to manufacture the probing device being superior in accuracy of positioning the tips of the probes even under the high temperature, as well as easily coping with the change of the electrode pattern.

However, the probing device according to the present invention should not be restricted only to the semiconductor elements as the object to be contacted with, however it can be applied as a probing device for electrodes opposing to each other, and can be manufactured even with the narrow pitch and/or the multi-pins.

Further, according to the present invention, it is possible to manufacture, with ease and high efficiency, a probing device, with which certain connections can be obtained with the respective electrodes aligned on the object to be tested even with a light load, and further transfer of the high speed signals being higher than several hundreds MHz in the frequency with the probes shortened.

Furthermore, according to the present invention, it is possible to manufacture the semiconductor elements by enabling the performance test thereon, which necessitate the operation test with the high-speed signals due to the advance in the high density and the narrow pitch.

What is claimed is:

1. In the production of a semiconductor device, a method of testing the semiconductor device comprising;
   a positioning step which positions said semiconductor device to be tested at a set position;
   a contacting step which contacts a contact electrode having a plurality of projecting contacting tips formed on a first surface of an insulating sheet of a connection part of a testing apparatus with an electrode of said semiconductor device, said plurality of projecting contacting tips being formed by etching a first conductor layer or a second conductor layer on said first conductor layer, said first conductor layer being formed on said first surface of said insulating sheet; and a signal transferring step which transfers electric signals to said electrode of said semiconductor device from said testing apparatus through said contact electrode having said plurality of projecting contacting tips and a wiring conductor connected with said contact electrode for conducting a test signal on said semiconductor device; and wherein during said contacting step and said signal transferring step, said plurality of projecting contacting tips on a single contact electrode contact with one electrode of said semiconductor device.

2. In the production of a semiconductor device, a method of testing the semiconductor device as defined in claim 1, wherein each of said plurality of projecting contacting tips is from 1 μm to 200 μm in height.

3. In the production of a semiconductor device, a method testing the semiconductor device as defined in claim 1, wherein said contact electrode of said object semiconductor device is from 200 μm to 600 μm in diameter.

4. In the production of a semiconductor device, a method of testing the semiconductor device as defined in claim 1, wherein said semiconductor device is tested in a burn-in state of giving electrical and thermal stresses under the condition of a set temperature.

5. In the production of a semiconductor device, a method of testing the semiconductor device as defined in claim 1, wherein said electric signals re transferred to said electrode of said semiconductor device from said testing apparatus through said contact electrode having said plurality of projecting contacting tips which is formed on a surface of an insulator sheet and a wiring conductor formed on an opposite surface of said insulator sheet connected with said contact electrode by a via hole.

6. In the production of a semiconductor device, a method of testing the semiconductor device as defined in claim 1, wherein each of said plurality of projecting contacting tips has a flat outer end which contacts said electrode of said semiconductor device.

7. In the production of a semiconductor device, a method of testing the semiconductor device as defined in claim 1, wherein said connection part includes a wiring sheet formed from said wiring conductor and said contact electrode having said plurality of projecting contact probes, is supported by a supporting member having means for applying approximately constant contacting pressure to said wiring sheet to obtain electrical conduction between said contact electrode having said plurality of projecting contact probes and said electrode of said semiconductor device.

8. In the production of a semiconductor device, a method of testing the semiconductor device as defined in claim 1, wherein said plurality of projecting contacting tips are cylindrical.

9. In the production of a semiconductor device, a method of testing the semiconductor device as defined in claim 1, wherein on a wiring sheet having said wiring conductor and said insulating sheet, an element or part connected with said wiring conductor adjusts impedance and passes said test signal during said signal transferring step.

10. In the production of a semiconductor device, a method of testing the semiconductor device as defined in claim 1, wherein said electrode of said semiconductor device with which said plurality of projecting contacting tips on a single contact electrode of said testing apparatus contact, is a bump.

11. In the production of a wafer having a plurality of aligned semiconductor devices mounted thereon, a method of testing each semiconductor device comprising;

an aligning step which aligns a plurality of semiconductor devices on a wafer;

a positioning step which positions said wafer to be tested at a set position;

a contacting step which contacts a contact electrode having a plurality of projecting contacting tips formed on a first surface of an insulating sheet of a connection part of a testing apparatus with an electrode of said semiconductor device aligned on said wafer, said plurality of projecting contacting tips being formed by etching a first conductor layer or a second conductor layer on said first conductor layer, said first conductor layer being formed on said first surface of said insulating sheet;

a signal transferring step which transfers electric signals to said electrode of said semiconductor device aligned on said wafer from said testing apparatus through said contact electrode having said plurality of projecting contacting tips and a wiring conductor connected with said contact electrode for conducting a test signal on said semiconductor device; and a dividing step which divides said wafer into a plurality of parts of individual semiconductor devices; and wherein during said contacting step and said signal transferring step, said plurality of projecting contacting tips on said contact electrode contact with one electrode of said semiconductor device.

12. In the production of a wafer having a plurality of aligned semiconductor devices mounted thereon, a method of testing each semiconductor device as defined in claim 11, wherein each of said plurality of projecting contacting tips if from 1 μm to 200 μm in height.

13. In the production of a wafer having a plurality of aligned semiconductor devices mounted thereon, a method of testing each semiconductor device as defined in claim 11, wherein said semiconductor device is tested in a burn-in state of giving electrical and thermal stresses under the condition of a set temperature.

14. In the production of a wafer having a plurality of aligned semiconductor devices mounted thereon, a method of testing each semiconductor device as defined in claim 11, wherein said electric signals are transferred to said electrode of said semiconductor device from said testing apparatus through said contact electrode having said plurality of projecting contacting tips formed on a surface of an insulator sheet and a wiring conductor formed on an opposite surface of said insulator sheet connected with said contact electrode by a via hole.

15. In the production of a wafer having a plurality of aligned semiconductor devices mounted thereon, a method of testing each semiconductor device as defined in claim 11, wherein each of said plurality of projecting contacting tips has a flat outer end which contacts said electrode of said semiconductor device.

16. In the production of a semiconductor device, a method of testing the semiconductor device as defined in claim 11, wherein said plurality of projecting contacting tips are cylindrical.

17. In the production of a semiconductor device, a method of testing the semiconductor device as defined in claim 11, wherein on a wiring sheet having said wiring conductor and said insulating sheet, an element or part connected with said wiring conductor adjusts impedance and passes said test signal during said signal transferring step.

18. In the production of a semiconductor device, a method of testing the semiconductor device as defined in claim 11, wherein said electrode of said semiconductor device with which said plurality of projecting contacting tips on a single contact electrode of said testing apparatus contact, is a bump.

19. In the production of a wafer having a plurality of aligned semiconductor devices mounted thereon, a method of testing each semiconductor device comprising;
   an aligning step which aligns a plurality of semiconductor devices on a wafer;
   a dividing step which divides said wafer into a plurality of parts of individual semiconductor devices;
   a positioning step which positions an individual semiconductor device to be tested at a set position;
   a contacting step which contacts a contact electrode having a plurality of projecting contacting tips formed on a first surface of an insulating sheet of a connection part of a testing apparatus with an electrode of said semiconductor device, said plurality of projecting contacting tips being formed by etching a first conductor layer or a second conductor layer on said first conductor layer, said first conductor layer being formed on said first surface of said insulating sheet;
   a signal transferring step which transfers electric signals to said electrode of said semiconductor device from said testing apparatus through said contact electrode having said plurality of projecting contacting tips and a wiring conductor connected with said contact electrode for conducting a test signal on said semiconductor device; and
   wherein during said contacting step and said signal transferring step, said plurality of projecting contacting tips contact with one electrode of said semiconductor device.

20. In the production of a wafer having a plurality of aligned semiconductor devices mounted thereon, a method of testing each semiconductor device as defined in claim 19, wherein each of said plurality of projecting contacting tips is from 1 µm to 200 µm in height.

21. In the production of a wafer having a plurality of aligned semiconductor devices mounted thereon, a method of testing each semiconductor device as defined in claim 19, wherein said semiconductor device is tested in a burn-in state of giving electrical and thermal stresses under the condition of a set temperature.

22. In the production of a wafer having a plurality of aligned semiconductor devices mounted thereon, a method of testing each semiconductor device as defined in claim 19, wherein said electric signals are transferred to said electrode of said semiconductor device from said testing apparatus through said contact electrode having said plurality of projecting contacting tips formed on a surface of an insulator sheet and a wiring conductor formed on an opposite surface of said insulator sheet connected with said contact electrode by a via hole.

23. In the production of a wafer having a plurality of aligned semiconductor devices mounted thereon, a method of testing each semiconductor device as defined in claim 19, wherein each of said plurality of projecting contacting tips has a flat outer end which contacts with said electrode of said semiconductor device.

24. In the production of a semiconductor device, a method of testing the semiconductor device as defined in claim 19, wherein said plurality of projecting contacting tips are cylindrical.

25. In the production of a semiconductor device, a method of testing the semiconductor device as defined in claim 19, wherein on a wiring sheet having said wiring conductor and said insulating sheet, an element or part connected with said wiring conductor adjusts impedance and passes said test signal during said signal transferring step.

26. In the production of a semiconductor device, a method of testing the semiconductor device as defined in claim 19, wherein said electrode of said semiconductor device with which said plurality of projecting contacting tips on a single contact electrode of said testing apparatus contact, is a bump.

27. In the production of a semiconductor device, a method of testing the semiconductor device comprising;
   a positioning step which positions said semiconductor device to be tested at a set position;
   a contacting step which contacts a contact electrode having a plurality of projecting contacting tips formed on a first surface of an insulating sheet of a connection part of a testing apparatus with an electrode of said semiconductor device, said plurality of projecting contacting tips being formed by electroplating with a mask formed on a first conductor layer, said first conductor layer being formed on said first surface of said insulating sheet;
   a signal transferring step which transfers electric signals to said electrode of said semiconductor device from said testing apparatus through said contact electrode having said plurality of projecting contacting tips and a wiring conductor connected with said contact electrode for conducting a test signal on said semiconductor device; and
   wherein during said contacting step and said signal transferring step, said plurality of projecting contacting tips on a single contact electrode contact with one electrode of said semiconductor device.

28. In the production of a semiconductor device, a method of testing the semiconductor device as defined in claim 27, wherein said plurality of projecting contacting tips are cylindrical.

29. In the production of a semiconductor device, a method of testing the semiconductor device as defined in claim 27, wherein on a wiring sheet having said wiring conductor and said insulating sheet, an element or part connected with said wiring conductor adjusts impedance and passes said test signal during said signal transferring step.

30. In the production of a semiconductor device, a method of testing the semiconductor device as defined in claim 27, wherein said electrode of said semiconductor device with which said plurality of projecting contacting tips on a single contact electrode of said testing apparatus contact, is a bump.

31. A method of manufacturing a semiconductor device comprising;
- a positioning step which positions said semiconductor device at a set position;
- a contacting step which contacts a contact electrode having a plurality of projecting contacting tips formed on a first surface of an insulating sheet of a connection part of a testing apparatus with an electrode of said semiconductor device, said plurality of projecting contacting tips being formed by etching a first conductor layer or a second conductor layer on said first conductor layer, said first conductor layer being formed on said first surface of said insulating sheet; and
- a signal transferring step which transfers electric signals to said electrode of said semiconductor device from said testing apparatus through said contact electrode having said plurality of projecting contacting tips and a wiring conductor connected with said contact electrode for conducting a test signal on said semiconductor device; and
- wherein during said contacting step and said signal transferring step, said plurality of projecting contacting tips on a single contact electrode contact with one electrode of said semiconductor device.

32. A method of manufacturing a wafer having a plurality of aligned semiconductor devices comprising;
- an aligning step which aligns a plurality of semiconductor devices on a wafer;
- a positioning step which positions said wafer at a set position;
- a contacting step which contacts a contact electrode having a plurality of projecting contacting tips formed on a first surface of an insulating sheet of a connection part of a testing apparatus with an electrode of said semiconductor device aligned on said wafer, said plurality of projecting contacting tips being formed by etching a first conductor layer or a second conductor layer on said first conductor layer, said first conductor layer being formed on said first surface of said insulating sheet;
- a signal transferring step which transfers electric signals to said electrode of said semiconductor device aligned on said wafer from said testing apparatus through said contact electrode having said plurality of projecting contacting tips and a wiring conductor connected with said contact electrode for conducting a test signal on said semiconductor device; and
- a dividing step which divides said wafer into a plurality of parts of individual semiconductor devices; and
- wherein during said contacting step and said signal transferring step, said plurality of projecting contacting tips on said contact electrode contact with one electrode of said semiconductor device.

33. A method of manufacturing a wafer having a plurality of aligned semiconductor devices comprising;
- an aligning step which aligns a plurality of semiconductor devices on a wafer;
- a dividing step which divides said wafer into a plurality of parts of individual semiconductor devices;
- a positioning step which positions an individual semiconductor device to be tested at set position;
- a contacting step which contacts a contact electrode having a plurality of projecting contacting tips formed on a first surface of an insulating sheet of a connection part of a testing apparatus with an electrode of said semiconductor device, said plurality of projecting contacting tips being formed by etching a first conductor layer or a second conductor layer on said first conductor layer, said first conductor layer being formed on said first surface of said insulating sheet;
- a signal transferring step which transfers electric signals to said electrode of said semiconductor device from said testing apparatus through said contact electrode having said plurality of projecting contacting tips and a wiring conductor connected with said contact electrode for conducting a test signal on said semiconductor device; and
- wherein during said contacting step and said signal transferring step, said plurality of projecting contacting tips contact with one electrode of said semiconductor device.

34. A method of manufacturing a semiconductor device comprising;
- a positioning step which positions said semiconductor device at a set position;
- a contacting step which contacts a contact electrode having a plurality of projecting contacting tips formed on a first surface of an insulating sheet of a connection part of a testing apparatus with an electrode of said semiconductor device, said plurality of projecting contacting tips being formed by electroplating with a mask formed on a first conductor layer, said first conductor layer being formed on said first surface of said insulating sheet;
- a signal transferring step which transfers electric signals to said electrode of said semiconductor device from said testing apparatus through said contact electrode having said plurality of projecting contacting tips and a wiring conductor connected with said contact electrode for conducting a test signal on said semiconductor device; and
- wherein during said contacting step and said signal transferring step, said plurality of projecting contacting tips on a single contact electrode contact with one electrode of said semiconductor device.

* * * * *